(12) United States Patent
Bennett

(10) Patent No.: US 10,985,162 B2
(45) Date of Patent: Apr. 20, 2021

(54) SYSTEM FOR ACCURATE MULTIPLE LEVEL GAIN CELLS

(71) Applicant: John Bennett, Sammamish, WA (US)

(72) Inventor: John Bennett, Sammamish, WA (US)

( * ) Notice: Subject to any disclaimer, the term of this patent is extended or adjusted under 35 U.S.C. 154(b) by 0 days.

(21) Appl. No.: 16/221,170

(22) Filed: Dec. 14, 2018

(65) Prior Publication Data
US 2020/0194433 A1 Jun. 18, 2020

(51) Int. Cl.
*H01L 27/108* (2006.01)
*G11C 11/56* (2006.01)
*G11C 11/409* (2006.01)
*H01L 27/07* (2006.01)

(52) U.S. Cl.
CPC ...... *H01L 27/10805* (2013.01); *G11C 11/409* (2013.01); *G11C 11/565* (2013.01); *H01L 27/0727* (2013.01)

(58) Field of Classification Search
CPC .......... H01L 27/10805; H01L 27/0727; H01L 27/108; G11C 11/565; G11C 11/409
See application file for complete search history.

(56) References Cited

U.S. PATENT DOCUMENTS

| | | | |
|---|---|---|---|
| 2,218,340 A | 10/1940 | Maurer | |
| 3,387,286 A | 6/1968 | Dennard | |
| 3,533,089 A | 10/1970 | Wahlstrom | |
| 3,614,749 A | 10/1971 | Radcliffe, Jr. | |
| 4,189,782 A * | 2/1980 | Dingwall | G11C 11/418 326/108 |
| 4,661,929 A | 4/1987 | Aoki et al. | |
| 4,709,350 A | 11/1987 | Nakagome et al. | |
| 5,122,986 A * | 6/1992 | Lim | G11C 11/403 365/150 |
| 5,283,761 A | 2/1994 | Gillingham | |
| 5,666,323 A | 9/1997 | Zagar | |

(Continued)

FOREIGN PATENT DOCUMENTS

WO 2005064615 A2 7/2005

OTHER PUBLICATIONS

Endoh et al., "2.4F/sup 2/ memory cell technology with stacked-surrounding gate transistor (S-SGT) DRAM," IEEE Transactions on Electron Devices, 48(8):1599-1603, Aug. 2001.

(Continued)

*Primary Examiner* — Laura M Menz
*Assistant Examiner* — Khatib A Rahman
(74) *Attorney, Agent, or Firm* — Davis Wright Tremaine LLP

(57) ABSTRACT

A dynamic gain cell memory cell capable of storing multiple values is described herein. In one example, a memory cell may include an input, such as a first transistor. The memory cell may further include a capacitive element coupled to the input, where the capacitive element stores one or more values corresponding to one of multiple voltage levels. A sense transistor configured to operate in source-follower mode may be coupled to the capacitive element, where the charge on the capacitive element controls operation of the sense transistor, such as through a gate of the sense transistor. The memory cell may further include an output connected to the drain of the sense transistor, where current flows through the transistor when the output is activated to access the one or more values stored in capacitive element.

14 Claims, 22 Drawing Sheets

(56) References Cited

U.S. PATENT DOCUMENTS

| | | | |
|---|---|---|---|
| 5,717,632 A | 2/1998 | Richart et al. | |
| 5,761,114 A | 6/1998 | Bertin et al. | |
| 5,784,328 A | 7/1998 | Irrinki et al. | |
| 5,808,930 A | 9/1998 | Wada et al. | |
| 5,808,932 A * | 9/1998 | Irrinki | G11C 11/565 365/150 |
| 5,909,400 A * | 6/1999 | Bertin | G11C 11/406 365/187 |
| 5,943,270 A * | 8/1999 | Borkar | G11C 11/403 365/104 |
| 6,016,268 A * | 1/2000 | Worley | G11C 11/565 365/149 |
| 6,246,083 B1 * | 6/2001 | Noble | H01L 27/108 257/296 |
| 6,751,142 B2 | 6/2004 | Hanzawa et al. | |
| 6,804,142 B2 * | 10/2004 | Forbes | G11C 11/405 257/300 |
| 6,853,579 B1 * | 2/2005 | Chou | G11C 11/412 365/154 |
| 6,977,519 B2 | 12/2005 | Bhavnagarwala et al. | |
| 6,982,897 B2 | 1/2006 | Luk et al. | |
| 7,221,580 B1 * | 5/2007 | Penchuk | G11C 11/405 365/149 |
| 8,395,931 B2 * | 3/2013 | Yamazaki | H01L 27/1052 365/149 |
| 8,559,220 B2 | 10/2013 | Yamazaki et al. | |
| 9,424,923 B2 * | 8/2016 | Nagatsuka | G11C 7/22 |
| 9,443,844 B2 * | 9/2016 | Takemura | G11C 11/405 |
| 2012/0287700 A1 * | 11/2012 | Takemura | G11C 11/405 365/149 |
| 2014/0254241 A1 | 9/2014 | Shiimoto | |
| 2015/0043279 A1 * | 2/2015 | Yamauchi | G11C 16/0408 365/185.18 |
| 2015/0092479 A1 | 4/2015 | Dong | |
| 2016/0372168 A1 * | 12/2016 | Lynch | G11C 7/1051 |
| 2018/0069546 A1 * | 3/2018 | Shankar | H03K 17/08 |

OTHER PUBLICATIONS

Hasegawa et al., "An experimental DRAM with a NAND-structured cell," IEEE Journal of Solid-State Circuits, 28(11):1099-1104, Nov. 1993.
Itoh, "VLSI Memory Chip Design," Springer-Verlag Berlin Heidelberg, Apr. 2001, pp. 13-15.
Khalid, "Multilevel Gain Cell Arrays for Fault-Tolerant VLSI Systems," Linköping University, Department of Electrical Engineering, Division of Electronics Systems, Master's Thesis Spring 2011, Sep. 5, 2011, retrieved Dec. 28, 2018 from http://liu.diva-portal.org/smash/get/diva2:478155/FULLTEXT01.pdf, 90 pages.
Khalid, et al., "Replica Bit-Line Technique for Embedded Multi-level Gain-Cell DRAM," 10th IEEE International NEWCAS Conference, Jun. 17, 2012, retrieved Dec. 28, 2018 from https://infoscience.epfl.ch/record/178153/files/11norchip.pdf, 4 pages.
Meinerzhagen et al., "Gain-Cell Embedded DRAMs for Low-Power VLSI Systems-on-Chip," Springer International Publishing, © 2018, pp. 13, 14, 20-22, 51, 52.
Meinerzhagen et al., "Logic-Compatible Multilevel Gain-Cell-Based DRAM for VLSI-SoCs," Integrated Systems Laboratory, ETH Zurich, Switzerland, Sep. 24, 2010, retrieved Dec. 28, 2018 from https://infoscience.epfl.ch/record/178204/files/ poster.pdf, 1 page.
Nakamura et al., "Novel NAND DRAM with surrounding gate transistor (SGT)-type gain cell," Electronics and Communications in Japan (Part II: Electronics) 87(7):1-8, Jun. 9, 2004.
Siddiqi et al., "Dynamic RAM: Technology Advancements," CRC Press, Taylor & Francis Group, Dec. 19, 2012, pp. 6-9.
Wang et al., "Adaptive Refresh Structure for Gain Cell Embedded DRAM," Microelectronics Journal, vol. 48, Feb. 2016, pp. 81-86.
International Search Report and Written Opinion dated Feb. 13, 2020, in International Patent Application No. PCT/US2019/061528, filed Nov. 14, 2019, 8 pages.
U.S. Appl. No. 16/395,081, filed Apr. 25, 2019.

\* cited by examiner

US 10,985,162 B2

1

SYSTEM FOR ACCURATE MULTIPLE LEVEL GAIN CELLS

BACKGROUND

The original conception of the dynamic random access memory cell (DRAM) was by Robert Dennard at IBM in 1968. It was dynamic because there would be leakage of charge from the capacitor and so a periodic read and rewrite operation would be needed for restoring the correct charge levels, to accurately store bits for varying time periods. It had a destructive read-out requiring the data to be rewritten after being read (which was a familiar requirement since magnetic core memory had destructive reads, also).

This design was not translated into a commercial product until several years later, but it became the standard design, and variants of this design suitable for evolving device processes have dominated the DRAM market, in large part because this design provides smallest cell and can be fabricated with the largest number of cells per chip.

It took a few years before this 1 transistor 1 capacitor per cell design (1T1C) became the norm in commercial use, in large part because the physical designers had to master techniques for adding adequately sized capacitors to the logic process. Designs descended from Dennard's idea account for more than 99% of RAM memory bits. An exemplary diagram of a Dennard 1T1C cell is illustrated in FIG. 1.

The first commercially successful DRAM was the Intel 1103 in 1971, an exemplary diagram of which is illustrated in FIG. 2. It used a 3 transistor cell which stored charge on the intrinsic capacitance of the gate of the second transistor (T2) and had a non-destructive readout so there was no need to rewrite a cell every time you read it. In this "3T1C" design, the dynamic nature is that charge leaks away from the gate capacitor and needs to be restored by a refresh cycle. The read out was not destructive so it did not require data to be rewritten each time it was read. This was a gain cell, although the terminology was coined later.

This design became commercially available and successful before Dennard's design in part because, in 1971, the non-destructive read was a significant simplification, and because it did not require the separate steps of chip processing needed to form a capacitor. Over time, those advantages faded relative to the size advantage of Dennard's design. 3T1C designs still have some use in embedded memory where their size and speed are a reasonable balance, and compatibility with processes used for logic chips makes it possible to put them beside related logic blocks on the same chip.

The 1103 circuit can be simplified by using the same line for data in and data out, just as with a Dennard design. This means the array cannot operate with separate read and write ports, but the layout size reduction from avoiding the second data line proved more valuable for basic DRAM. An example diagram of this design is illustrated in FIG. 3. Worley proposed this as well as the Intel 1103 circuit in U.S. Pat. No. 6,016,268 A for a claimed multi-level cell that store multiple values, not limited to binary.

Prior gain cells with multiple levels relied primarily on current sensing. One such approach came out of IBM in 1997. An example of this design is illustrated in FIG. 4. This approach used a declining voltage applied to the source of T2 (the sense transistor) so that the transistor would turn on when the source voltage goes under the voltage on the capacitor. While this approach makes use of voltage to differentiate charge, it would be relatively slow. It may have

2 been used in production for embedded memory in some successful parts but seems not to be in wide-spread continued use.

Accordingly, improvements can be made in the field of dynamic memory.

Figure 1:
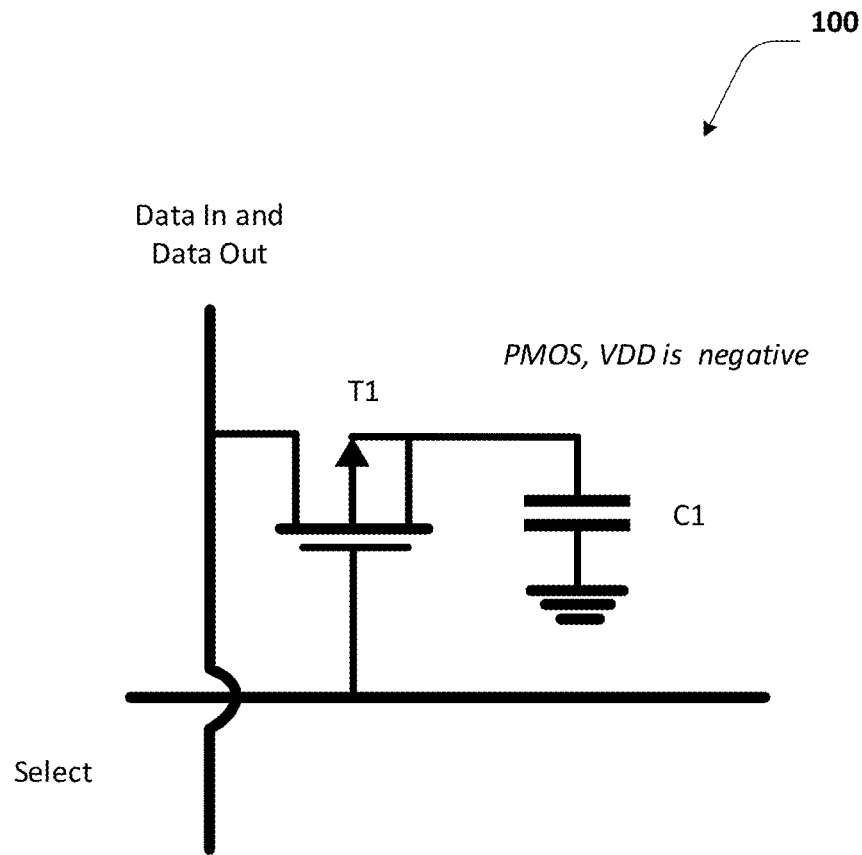
FIG. 1 illustrates an exemplary diagram of a one transistor, one capacitor (1T1C) Dynamic Random Access Memory (DRAM) cell.
Figure 2:
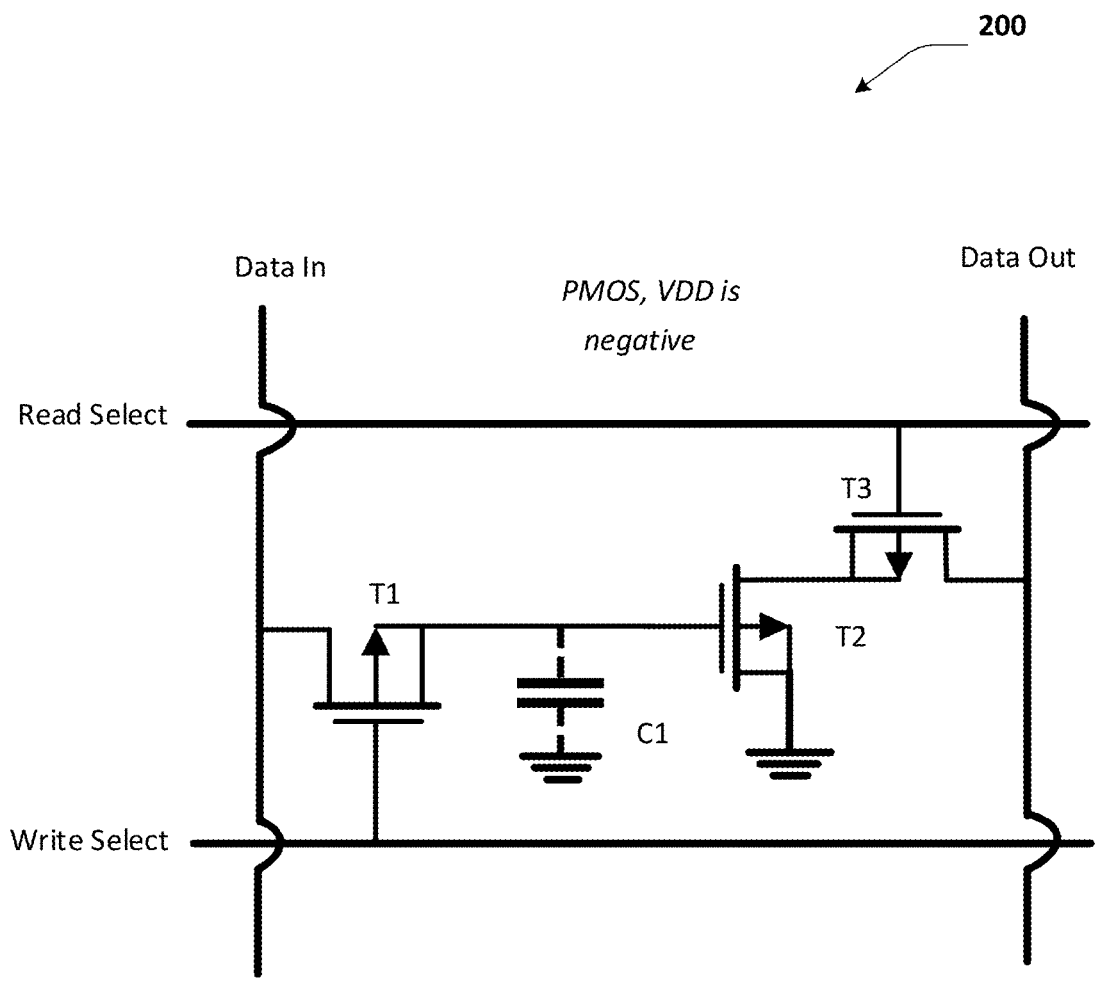
FIG. 2 illustrates an exemplary diagram of a three transistor, one capacitor (3T1C) Dynamic Random Access Memory (DRAM) cell.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include methods and systems for a random access dynamic memory (DRAM) gain cell and array which enables the accurate writing and reading of multiple levels in a gain cell memory. The DRAM gain cell and array, described herein, address one or more of the above-noted problems with prior DRAM cells.

A gain cell is a form of dynamic memory which uses sense transistors to support non-destructive access to the contents of the cell. In some aspects, the read out of the described DRAM gain cell may provide a higher signal to noise ratio, which is compatible and allows for improvements over current DRAM cells, such as faster read-out, use of smaller capacitance, and use of various charge levels to represent multiple bits of information per cell.

The described memory cell uses charge storage in a capacitor, which will eventually leak away and need a refresh back to original levels. A second transistor in included in each cell to sense the charge without removing charge, so the act of reading the cell does not remove charge and there is no need for a refresh cycle to be included in every read, as there is in a fully dynamic random access memory. The sense transistor may also amplify the readout, which improves signal strength. Additional transistors and or diodes may be added to the described gain cell to enhance signal to noise ratio and for other benefits.

In contrast to all known prior DRAM cells using a sense transistor, the described gain cell is designed to have a linear response permitting the capacitor to be tracked across a wide range of voltage. This novel arrangement enables a new range of precisely initialized multi-value cells. Read out is based upon voltage differences, not upon sensing current differences. This approach makes better use of the variation in electrons which can be stored on the capacitor.

Figure 3:
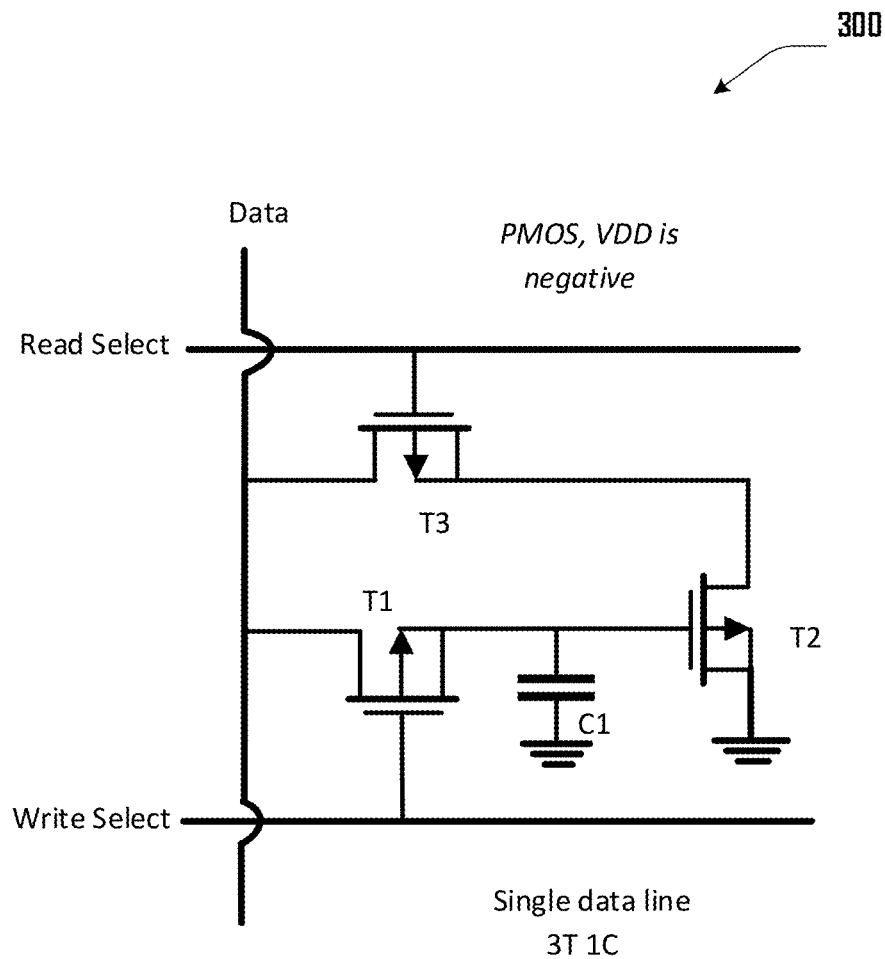
FIG. 3 illustrates another exemplary diagram of a three transistor, one capacitor (3T1C) Dynamic Random Access Memory (DRAM) cell.
Figure 4:
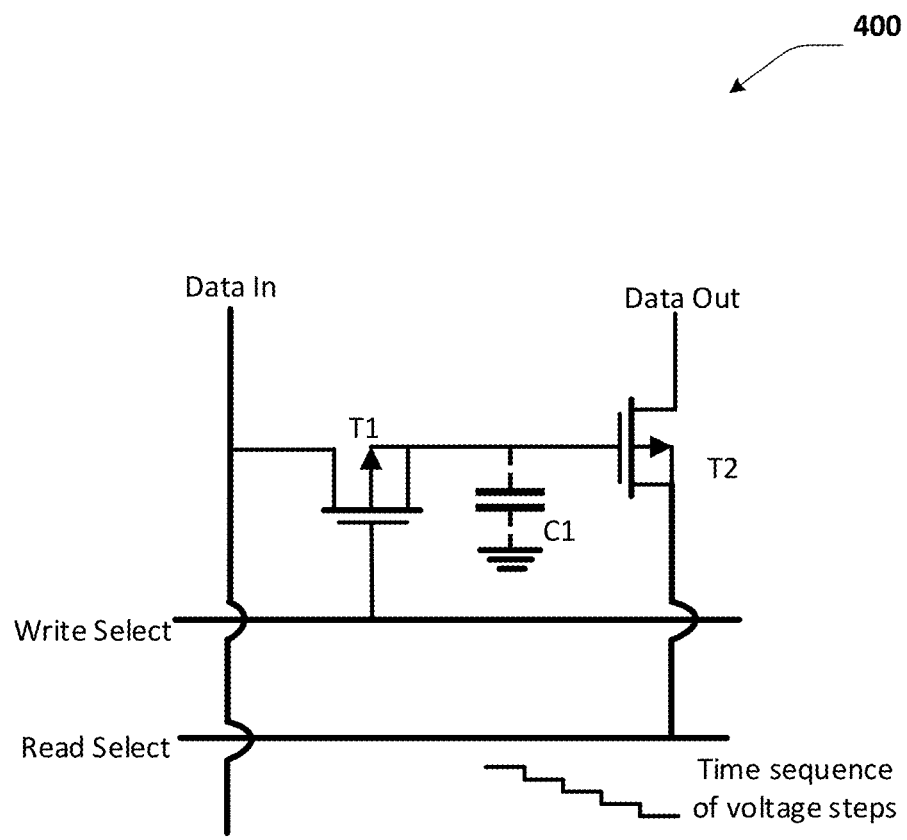
FIG. 4 illustrates an exemplary diagram of a gain cell.

The multi-level cell design proposed by Worley, as illustrated in FIG. 3, is impractical, for a number of reasons. That approach depends on different current levels driven by T2, but that is an inefficient method. Only a small voltage range on C1 may be usable since T2 amplifies, but that limits the number of useful electrons stored on C1. T2 is also non-linear, which further complicates setting a range of electrons. The current-drive approach does not scale to today's devices. The design illustrated in FIG. 4 is not current modulating, and uses a source-coupled mode of operation for the sense transistor. This is also a linear approach, but cannot deliver the range of benefits which a source-follower configuration enables. Current sensing in prior gain cells with multiple levels poses problems of small voltage range on the capacitor and statistical variation between cells. While this approach makes better use of capacitance to differentiate capacitance, it is relatively slow and is not compatible with using feedback during write operations for fast, accurate writing. No known prior design solved the speed, accuracy, and statistical variation difficulties which the described systems and methods address.

The source follower mode of transistor operation, of the present disclosure, maximizes the spread of useful voltage on the capacitance in a memory cell and reports it more linearly. A constant current load may be driven into the data read line to optimize this benefit while minimizing power used. These features improve the ability of the cell to hold and read out multiple voltage (charge) levels so that a cell may hold more than one bit of information.

In some cases, by itself, this would not be enough to overcome the problems of statistical variation, and the usefulness of the design could be limited to small arrays as has been the case with previous approaches to multi-value DRAM cells. These approaches were eventually discarded as impractical at larger scale on smaller geometries. In some embodiments, the described systems and methods incorporate direct simultaneous feedback from each cell being written, so that the level of charge in the cell will be whatever satisfies the complete feedback loop to deliver the ideal output. This feedback loop includes the read path as it will be used to obtain data values, and thus each statistically varying element is compensated for at the time of writing.

Gain cells may be addressed, read from, and written to via word and cell lines. The terms "word" refers to a set of cells to be read or written in parallel, which is typically many cells with data. "Cell lines" are used to read or write individual cells. These organizations usually run across each other at right angles, so one word line may touch upon a word of thousand or more cells, while the cell lines cross that word touching only one cell in that word. The cell lines may touch cells in other words, but the activation through the word line is necessary, and the other words remain passive, contributing only leakage and capacitance loads on the cell lines. "Word lines" are sometimes called "select" lines, and "cell" lines may be called "data" lines.

In some examples, the described cell has a word line and cell line grid arrangement to select the cell and program it, while also having a word line and cell line grid which select the cell for read-out. This allows the output to be selected separately from the input. When used for a single bit cell designed for fast operation, this may be used to allow words of memory to be read even while another word is simultaneously being programmed with new values. This configuration may be used in a novel way to monitor the charge level of a cell while it is being programmed so as to provide feedback on reaching an accurate level on the cell. This feedback can compensate for variations in the cells to ensure that the output that is delivered matches the intended or nominal value, regardless of variations in cell size and transistor amplification.

In some aspects, multiple cells may be grouped into a word which represents multiple data values written or read in parallel. An input select line may change between states to activate or deactivate together the input transistors T1 of all cells in the word. In some cases, the read select mechanism operates for all cells in a word to activate or deactivate all the cells in that word. In some cases, activation of a cell is via a diode that passes current from a read select line in a forward direction to the drain of the sensing transistor T2 when selected. In yet some cases, activation is via a read select line that activates the gate of the enabling transistor T3 while providing a voltage and current to the channel of T3 which may then flow through activated T3 to the drain of the sensing transistor T2.

In some aspects, the source end of the channel of T2 in each cell of the word may connect to a data output line which is not shared with any other cell in that word. In some examples, a passive impedance load or a substantially constant current load may be provided to drain current off the data output line.

In some aspects, each cell of each word is provided with an input data line not shared by another cell in the word and an output data line not shared by another cell in the word. These two lines of each word may be connected to writing and reading circuitry which may operate simultaneously. In some cases, the input and output data lines may be assisted by relay circuits in reaching the writing and reading circuitry which may be distant.

In some cases, extra reference cells may be included in, which do not hold data but improve the accuracy of deciding the data value in neighboring data cells by holding a reference value for comparison. References cells may be included in the feedback loop or mechanism. In some cases, extra cells can be interleaved into each word, which serve to track the decay in each word and adjust the threshold levels for read-out to reflect the decay over the length of time that word has been stored since its most recent programming or refresh.

In some examples, the reading circuitry may provide feedback to the writing circuitry so that when the word is enabled both for reading and for writing, the feedback between the reader and writer of each cell individually causes the input to be modified so that the output may converge upon the intended or nominal value of the output value for the value level which is being written into each individual cell.

In some aspects, there may be 1, 2, or more standard reference values in use, each for a different reference or dummy cell, so that accurate inferences about the change in intended values over time may be made. In some cases, the dummy cells are read at the same time as the other cells and a functional circuit uses the changes in the output of the dummy cells to adjust the threshold values expected from nearby data cells so as to best reflect changes due to leakage over time and process or environmental variations which affect the cells during retention. In some aspects, the nominal values of the dummy cells are set back to their ideal level at the same time the data cells of the word are written. In some cases, the reader circuitry uses estimated threshold values to make a best available decision as to the correct value which was stored in the cell. In some example, a word may be augmented with additional cells which enable redundancy, error correction, and error detection upon the values in the word when the word is read so as to compensate for the probability of errors.

In some aspects, the value of a cell may be read out, such as within a period of time short enough that the value in the cells has not become irretrievable, and a corrected value refreshed into the word at ideal voltage and charge levels. In some cases, the value read may be reliably established using error correction values in additional cells before the corrected value is refreshed into the word. In some examples, some of the refresh cycles may be performed when there is no explicit read or write operation occupying the read and write circuits.

In some cases, some of the select, data, and current source lines may be pre-charged ahead of the input select or read select lines so as to improve the performance and accuracy of cell operations under the performance limitations of small features, overcoming in particular delays and voltage settling times due to resistance and capacitance of the signaling lines.

The capacitor in the described cell may be a distinct capacitor similar to that used in a DRAM, or it may be some other kind of charge storage structure, for example a floating gate where the injection site is distinct from the gate of the read-out transistor. However, a distinct capacitor is important for storing multi-level data in one cell. Indeed, the need to combine a distinct capacitor with a multi-transistor cell to obtain multiple effective levels is probably why the described devices and techniques were basically absent over the past 20 years. The 2T and 3T designs in the past, beginning with the original Intel 1103, have taken advantage of the charge stored at transistor gates to avoid the size and complexity of separate capacitors. Sometimes a diode structure is incorporated since the inversion region in a diode is effectively a high permittivity capacitor, but it is still too small to allow multiple data levels to be stored reliably. Similarly, the 1T1C cell with its relatively large distinct capacitor cannot store multiple values because it is barely large enough to reliably be sensed when its charge is dumped out onto the cell lines, with resistance and capacitance diluting the value. As a result, the described gain cell's combination of multiple transistors and a distinct capacitor was not described in the past, and was taught away from, given the size constraints of DRAM cells.

It is only with the insight that it is worth going against the orthodoxy of each, adding a large distinct capacitor to a 2T or 3T design, or adding transistors to the 1T1C design, which seems to be wasteful, that the possibility of multiple data values is enabled. In one example, a full sized 1T1C cell design will have roughly 7 femto-Farads of capacitance and store roughly 20,000 electrons for a 0.5 Volt potential. This capacitor is far more complicated and specialized to build than a 3T1D cell using gate and diode structures for perhaps 1% of that capacity. Conversely, adding extra transistors to that 1T1C cell is going to reduce areal density of the capacitor array because the capacitor has evolved to match the 1T cell size.

However, with a 2T or 3T cell combined with a distinct capacitor, even a smaller 1 fF capacitor would store 3,000 electrons for a 0.5V potential, and the non-destructive buffered readout introduces the possibility of distinguishing many levels of data per cell. In one example implementation, a 16 level cell storing 4 bits of data would have differences of 200 electrons per step in value, which is a large enough number to be reliably controlled and sensed.

By itself, the above features and design changes may not be enough to overcome the advantages provided by prior designs. However, by arranging for a wide linear output from each cell, and accurately programming the level in the cell despite variations which are large and inevitable in small circuits, the described designs may become competitive to existing DRAM cells. These capabilities are not found in the prior art for DRAM since they are contrary to optimizing either the 1T1C or the 2T/3T versions. In both, the interests of shrinking the cell and increasing the certainty of readout drive for the use only of extremes of charge and for transistors to switch completely with just a small threshold between states, are quite non-linear. In order to obtain linear wide-range output from the cell, a change from using the Drain terminal of the transistor, such as a field effect transistor (FET), to using the Source is implemented. It should be appreciated that the described memory cells can be implemented using a variety of different transistors, including various types of FETs. The Drain output model offers the highest gain and narrow threshold, which is why it is the norm in every gain cell most if not all successful products. The "Source follower" circuit has lower gain, but when combined with a constant current load it will have almost linear characteristics. In some examples, a CMOS version can span almost the entire range of voltage from ground to Vdd with unity voltage gain, while still safeguarding the charge in the capacitor.

A means for accurate input of the precise charge level necessary to get the desired level of output may be based on the realization that the word lines for both input and output may be enabled simultaneously, which will result in the source-follower sensing circuit reporting out the data level in real time while the input sets the charge. The output for negative feedback upon the input driver may be used to ensure the input converges to a level where the output matches the standard nominal value. This nominal value is well defined and stable, while the feedback loop includes all the elements of the cell path which are included in reading out the cell. Once convergence is complete and the word input line is disabled, the input transistor become non-conductive and the capacitor will retain the charge necessary to repeat that same accurate nominal each time that output path is used.

It should be noted that the design is still dynamic and the charge does leak away over a period of, for example, milliseconds. The value will be read and refreshed before too long, but in the meantime the output level will change. Described herein are a number of improvements to address this, which may be implemented in part, in different combinations, or left out altogether. One improvement includes anchoring the capacitor not to the ground or Vdd voltages, but instead to a voltage mid-way through the voltage range needed. This halves the stress on the capacitor dielectric and either reduces the rate of leakage or enables the use of a dielectric with higher permittivity (which is inversely correlated to breakdown voltage).

Another improvement is to include some extra cells in the word, spaced across the word, on which a reference level may be placed, instead of data. Leakage is typically fairly uniform over small regions of a chip. As a result, additional cells may be incorporated in the word which will be quite close physically. These additional cells can be used to store a reference level at the same time as other cells of the word are written. Since this level is known, as the word loses charge over time the value on these cells can be used to recalibrate the levels expected on the cells that hold data. The reference values may be input into those reference cells at the same time as data cells are written so their aging begins at the same time.

Another improvement is the recognition that the leakage from the cells varies with the potential on them. As a result, a pattern of nominal levels can be used where the separation on data values of the larger values are larger, reflecting the faster leakage. This pattern may be combined with readout of the reference cells to give a calculated pattern of expected values (and expected threshold levels which separate the data values) varying over time correctly for their most likely values.

In some aspects, some level of error correction and redundancy may be incorporated into some embodiments in order to provide a more practical, competitive device. For example, the word may include extra data cells which contain redundancy codes for correction algorithms, such as maximum likelihood or low density parity codes, which detect incorrect data and restore the most likely correction. This can be supplemented by sparing words or even arrays which are found to be unreliable during initialization. It should be appreciated that DRAM does not accumulate defects like Flash cells do, and the analog circuits used for level detection, plus special algorithms and value sets used during initialization, can be used to identify unreliable cells and plan spares. A few spares may also be included on a chip which may be assigned during the later life of the chip for flaws which do develop in time.

It should be appreciated that the input and output circuits which drive the input and sense the output may become quite complex. It may be impractical to have such complex circuits dedicated to small arrays. Indeed, in many cases, only a small set of these for the whole chip may be desired, and in some cases, including one or more redundant sets of I/O circuits as well. Conversely, it may be undesirable for words to be too wide or the number of words in an array to be too large because that increases the power needed to drive the word and cell lines and decreases speed and accuracy due to those larger loads. In practice, a cell array with 4 bits per cell may advantageously have a 2048 data cell word and 2048 words. That would yield a 2 mega-byte array. However, that is likely only a fraction of a square millimeter of the chip, and there will be thousands of those arrays on a chip. In some cases, the chip overheads may be minimized using repeaters and/or linear wide range amplifiers on the input, output, or both to each such small array. The repeaters may be relatively simple and small circuits to allow multiple arrays each with repeaters to use a single shared set of the full I/O circuits for reference generation, negative feedback, calculation of changing output levels with leakage read out of the reference cells, error correction, and/or sparing rules.

In some aspects, cooled operation may allow for increased number of distinct data values or smaller cells.

At least two models of construction or designs are described herein. It should be appreciated that in some cases, one or more aspects of one design may advantageously be incorporated into the other design, for similar benefits, based on similar design characteristics or limitations, etc., even though those additions or combinations are not specifically described here.

In the "planar" model, both the input and output transistors may be formed on the surface of a semiconductor and the capacitance is added to the site by etching a capacitor under the surface or depositing a capacitor above the surface. In some cases, etching or adding the capacitor may be performed using known techniques applicable to implementing capacitors in DRAM. This approach adds to the area of the semiconductor occupied by each memory cell when compared to DRAM as the benchmark for density, as the cell includes more than one transistor and two sets of word/cell line grid, while 1T1C DRAM includes one transistor and one grid site per cell. By storing values for 2 or more data bits per cell, the described cell can provide advantages to existing DRAM, while still utilizing extra semiconductor space. The 2T and 3T cells are also known to offer faster operation and do not need a write after read, which both increase the utility of the memory. In addition, the planar design has the attraction that current low-leakage CMOS processing can be used and the transistors will both be high quality transistors formed in high quality crystalline semiconductor. This may convey lower leakage, stronger signal to noise, and faster operation.

In an "output above capacitor" model, the surface of the semiconductor includes or contains the input transistor for inserting charge into the cell, as well as the input grid for word and cell line selection of cells. The capacitor may be constructed above the input transistor with a connection to allow charge to flow to and from the capacitor (FETs allow bidirectional current flow). The sense transistor may be deposited above the capacitor so as to couple the charge in the capacitor to the gate of the sense transistor, where the gate is isolated from the transistor by a low leakage insulator. The additional diode (2T1C1D) or selector transistor (3T1C) may also be formed above the capacitor and connected to the sense transistor, along with the selection and output lines of the output grid. It is not expected to obtain a high quality single crystal through deposition, due to temperature limits set by the underlying materials (though if that process could be available, it would help). The gate insulator may be low leakage and the polycrystalline transistor may have sufficient quality to perform the source follower functionality with adequate speed. This form of the cell may be slower in operation, but it has a density advantage because the sense transistor and output crossing of word line and cell line can be formed on top of the cell with likely no increase in the area of the cell. The cases in which usage of this design are preferred over the planar design depend upon the practical quality of the epitaxial output devices and how small they may be.

Figure 5:
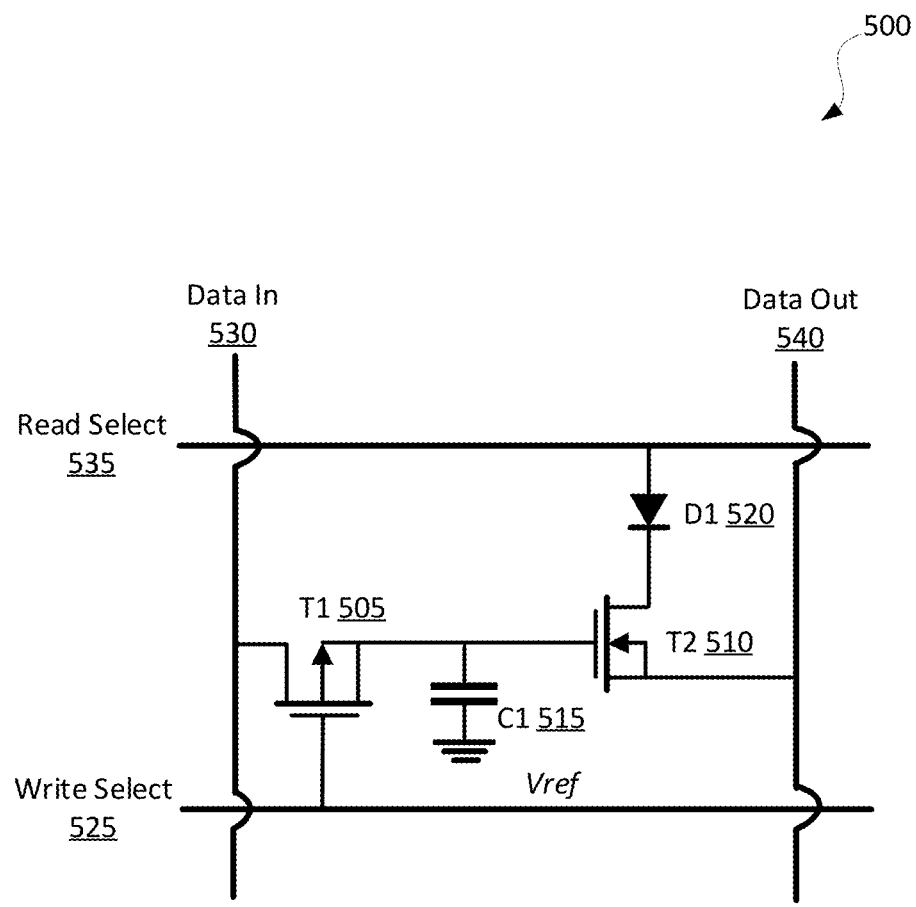
FIG. 5 illustrates an example schematic of a two transistor, one capacitor, one diode (2T1C1D) multi-level gain cell.
Figure 6:
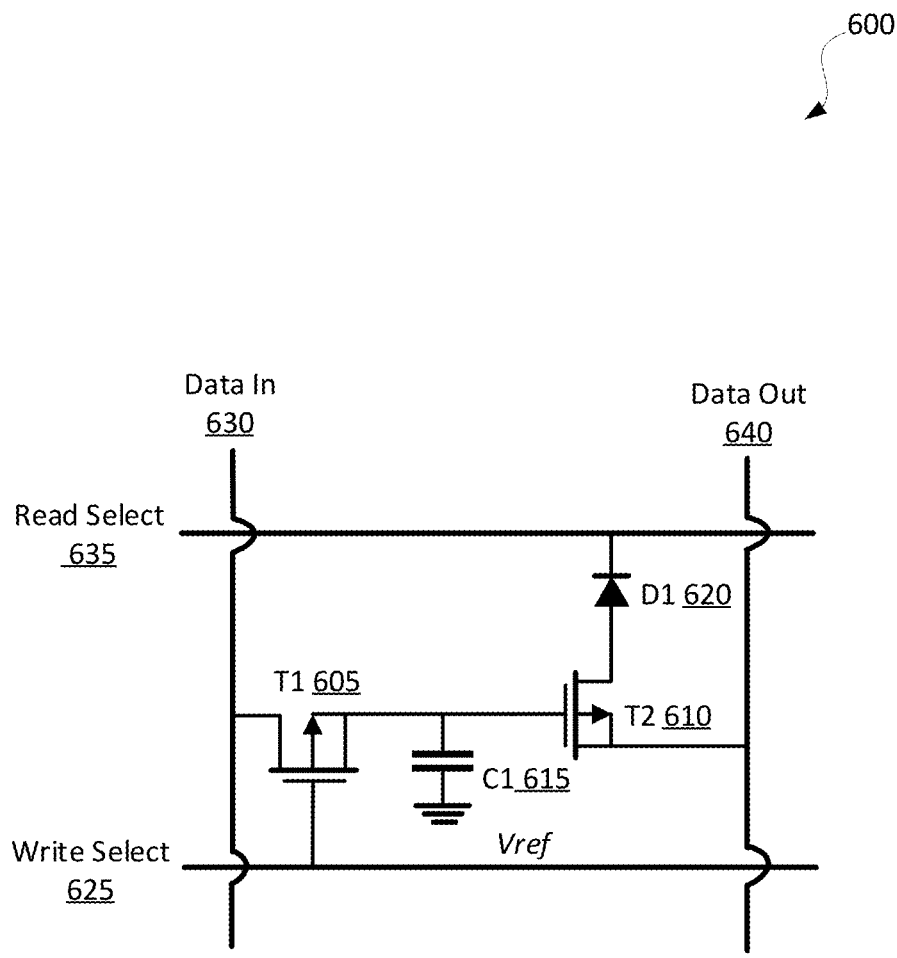
FIG. 6 illustrates example schematic of another two transistor, one capacitor, one diode (2T1C1D) multi-level gain cell.
Figure 7:
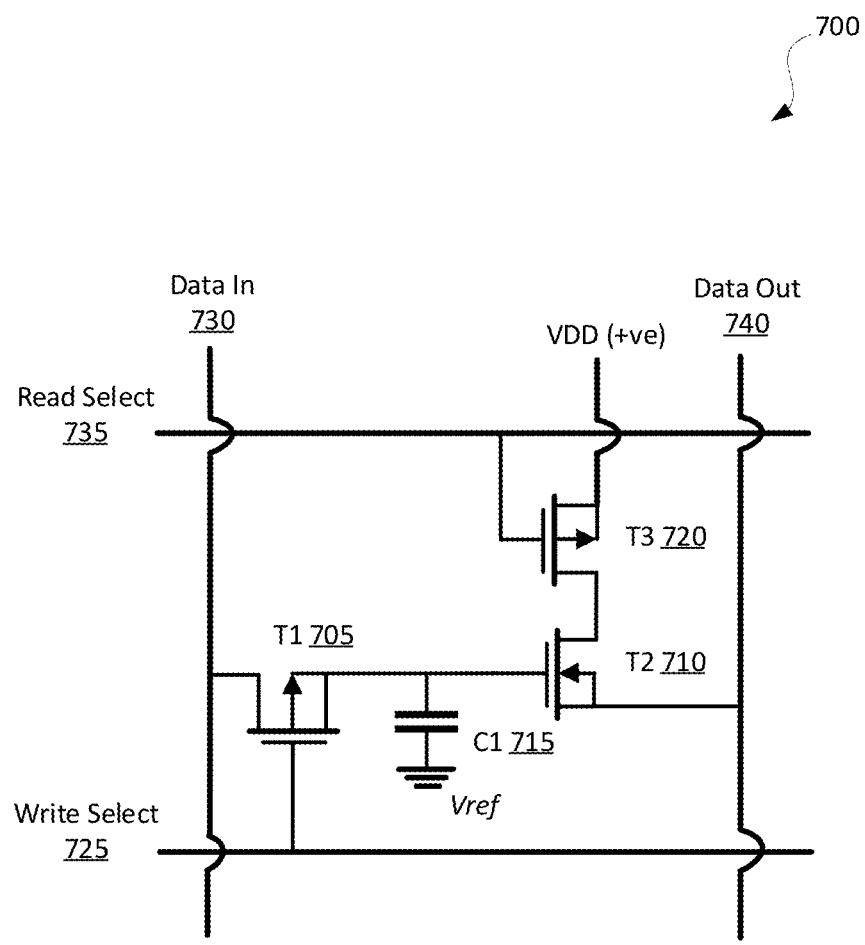
FIG. 7 illustrates an example schematic of a three transistor, one capacitor (3T1C) multi-level gain cell.

FIGS. 5-7, as will be discussed in greater detail below, illustrate example multi-level gains cell layouts 500, 600, and 700. It should be appreciated that layouts 500, 600, and 700 are only given as examples, and that there are other ways in which to layout the above described circuits 500, 600, and 700, without departing from the scope of the present disclosure. It should also be appreciated that features described in one example may apply to other examples, such as, for example, details concerning the capacitor used, transistors used, etc. As used herein, a multi-level gain cell may store multiple values of information, greater than one bit. Multi-level when used to refer to a gain cell is not intended to mean that it has to be formed or includes multiple levels (e.g., some designs may be planar or on a single level).

FIG. 5 illustrates an example design of a 2T1C1D multi-level gain cell 500, including 2 transistors, T1 505, and T2 510, one capacitor C1 515, and diode 520. Multi-level gain cell 500 may be implemented at least in part, or entirely, in CMOS.

In some aspects, a linear output uses voltage tracking as the output mechanism, with a source-follower circuit that can linearly track a wide range of voltage on C1 515. The fundamental change from prior designs is to operate T2 510 in source-follower mode. This reduces gain on T2 510 but makes better use of C1 515. In some aspects, one or more of transistors T1 505 or T2 510, or cell 500, may be constructed using CMOS. In some aspects, transistors T1 505, and/or T2 510 may include a P-channel FET, an N-Channel FET, or other types of transistors.

In cell 500, the word line or write select line 525 and input data line 530 combine to enable the input transistor T1 505 so that a level of charge may be set on the capacitor C1 515. Separately, the read select line 535 and data out line 540 combine to enable the charge on the cell, represented by C1 515, to be read out. The read select line 535 is raised to a positive voltage which enables current to flow through D1 520 and T2 510. In some cases, D1 520 may be used to ensure that there are no sneak paths allowing current to reach the data out line 540 by flowing backward through other cells to raise unwanted levels on read-select lines for other words. In some aspects, D1 520 may permit current to flow when the word read select line 535 carries voltage and current, which pass through D1 520 in its forward direction (which is also the forward direction for source follower operation of T2 510).

In some aspects, C1 515 may include elements which are not part of the transistors T1 505 and T2 510. In other aspects, C1 515 may include a buried capacitor such as a trench capacitor. In yet some aspects, C1 515 may include an overlying capacitor such as a capacitor formed from wires available in the metal connective layers, or a planar capacitor, or a trench capacitor in additional material layers. In some aspects, C1 515 may hold any of multiple different voltage levels, representing 1 or more bits of information including a number of levels which is not a power of 2, and thus not an integral number of bits.

In some aspects, C1 515 may be grounded or set to any stable intermediate voltage Vref. In some examples, ground, Vss, Vdd, or other stable level may be used. In some embodiments, the ground plane may be at a voltage in the middle of the range at which C1 515 is charged, so that stress on the dielectric is minimized. This refinement is possible on any of the variants presented here which use a distinct capacitor, subject to practicality of providing such a ground at a middle voltage. This design feature may be particularly beneficial when the capacitor C1 515 is constructed above the substrate.

FIG. 6 illustrates another example design of a 2T1C1D multi-level gain cell 600, including 2 transistors, T1 605, and T2 610, one capacitor C1 615, and a diode D1 620. Multi-level gain cell 600 may be implemented at least in part or entirely in PMOS.

T1 605 may be a PMOS transistor, as this type of transistor offers superior low leakage when turned off. T2 610 may be an NMOS transistor for its superior gain, but it is also possible to implement this circuit with a PMOS transistor, for example, with T2 610 in source follower mode. In this aspect, T2 610 and D1 620 will be inverted and the read select line 635 may be lowered rather than raised when active. T2 610 may still operate in a source-follower configuration where the source is connected to data out line 640. In some aspects, transistors T1 605, and/or T2 610 may include a P-channel FET, an N-Channel FET, or other types of transistors.

In some aspects, D1 620 may permit current to flow when the word read select line 635 carries voltage and current, which pass through D1 620 in its forward direction (which is also the forward direction for source follower operation of T2 610).

In some aspects, other parts of the gain cell 600 may be implemented in CMOS, including one or more of transistors 605 and 610, or other components of cell 600, for example depending on considerations of layout, leakage, and current drive. In the following additional examples, a person of ordinary skill in the art will appreciate how variants with different polarities of devices may be used to achieve the basic source-follower configuration with select and data signals.

In some aspects, C1 615 may include elements which are not part of the transistors T1 605 and T2 610. In other aspects, C1 615 may include a buried capacitor such as a trench capacitor. In yet some aspects, C1 615 may include an overlying capacitor such as a capacitor formed from wires available in the metal connective layers, or a planar capacitor, or a trench capacitor in additional material layers. In some aspects, C1 615 may hold any of multiple different voltage levels, representing 1 or more bits of information including a number of levels which is not a power of 2, and thus not an integral number of bits.

FIG. 7 illustrates an example design of a 3T1C linear output multi-level RAM cell 700, including 3 transistors, T1 705, and T2 710, and T3 720, and a capacitor C1 715. In some aspects, cell 700 may be implemented in part or entirely in CMOS. In some aspects, the word line or write select line 725 and input data lines 730 combine to enable the input transistor T1 705 so that a level of charge may be set on the capacitor C1 715. Separately, the read select line 735 and data out lines 740 combine to enable the charge on the cell 700 to be read out. The read select line 735 is lowered to a voltage which enables the PMOS transistor T3 720 so that current may flow to and through T2 710. T2 710 may operate in source follower mode to linearly track the voltage on C1 715. In some aspects, transistors T1 705, T2 710, and/or T3 720 may include a P-channel FET, an N-Channel FET, or other types of transistors.

T3 720 performs the same selection function and elimination of sneak paths which is done by D1 520 or 620 in the 2T 1C 1D designs, discussed above in reference to FIGS. 5 and 6. Using T3 720 instead of a diode may provide the advantage that less current must be switched to enable T3's 720 gate than to lift a current supply line for the diode. In some cases, a further advantage may be provided by this 3T design such that the enabled channel of T3 720 may be sized to drop much less voltage than needed to pass current through a diode. These changes in the 3T design can reduce the power consumption and increase the effective range of the linear circuit output. In some aspects, the 3T design may take up more space than a diode, for example, depending on details of the physical layout. In some aspects, the gate of T3 720 is activated by a word read select line 735 and the end of the channel of T3 720 opposite to T2 710 may be connected to a voltage and current source that will provide current when the word read select line 735 is active.

In some aspects, C1 715 may include elements which are not part of the transistors T1 705, T2 710, or T3 720. In other aspects, C1 715 may include a buried capacitor such as a trench capacitor. In yet some aspects, C1 715 may include an overlying capacitor such as a capacitor formed from wires available in the metal connective layers, or a planar capacitor, or a trench capacitor in additional material layers. In some aspects, C1 715 may hold any of multiple different voltage levels, representing 1 or more bits of information including a number of levels which is not a power of 2, and thus not an integral number of bits.

Figure 8:
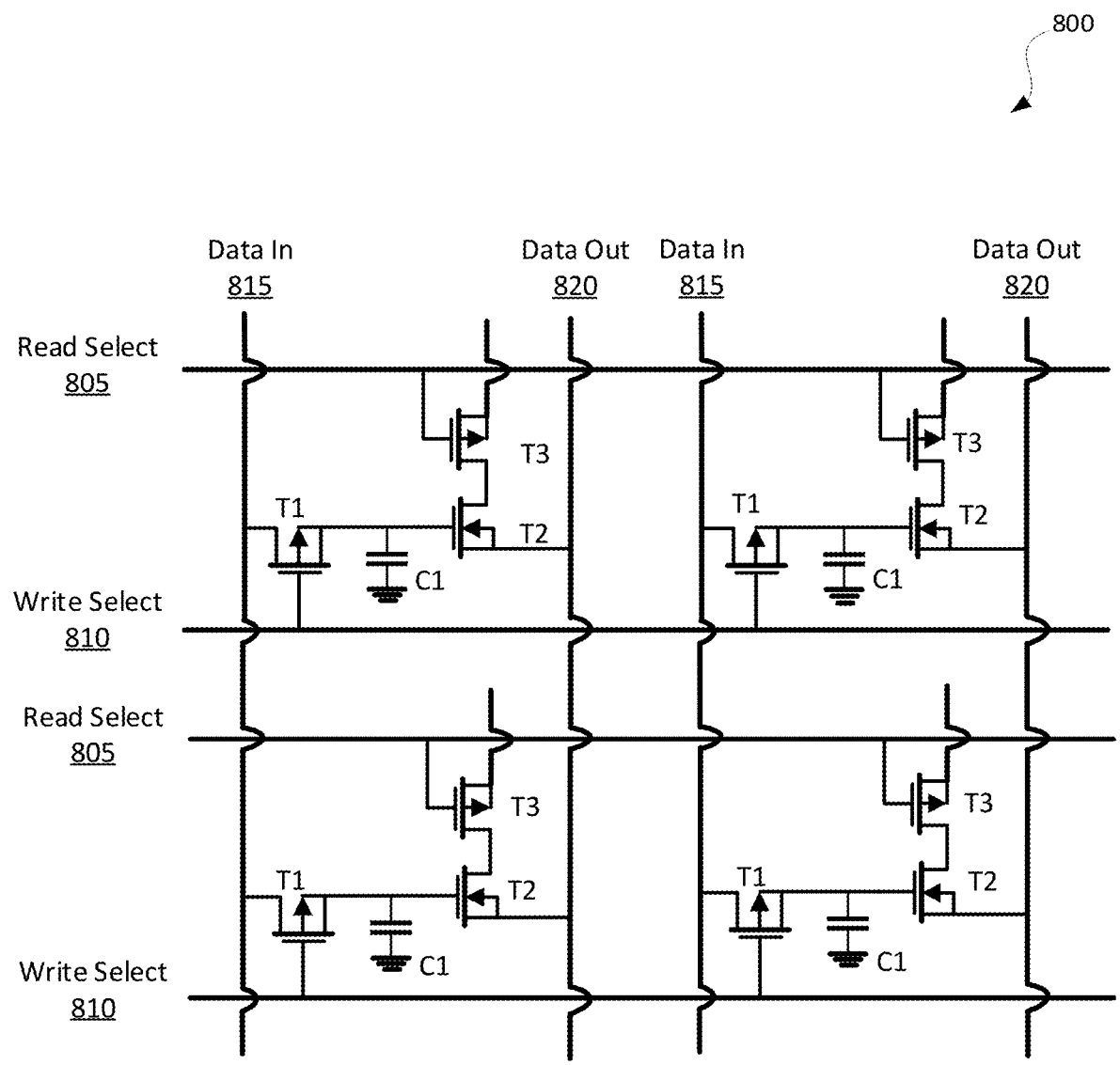
FIG. 8 illustrates an example array of multiple multi-level gain cells laid out adjacent in a grid.

FIG. 8 illustrates an example array 800 of multiple cells laid out adjacent in a grid. Each of the multiple cells in array 800 may be one or more of cells 500, 600, and/or 700 described above. In array 800, the word lines 805, 810 and cell lines 815, 820 are driven or sensed from the edges of the grid, for example, where the control circuits may be placed. It should be appreciated that the layout illustrated in FIG. 8 is only one example. The layout of an array of cells can be done in many ways. In some aspects, the cells may fit together like jigsaw pieces with irregular boundaries designed to complement each other, and the overall array may vary from strict row and column in order to accommodate packing rules for the large capacitors, for example, and conveniences in routing signals to avoid collision or crosstalk with each other. It should also be appreciated that the schematics presented here are symbolic representations which do not directly imply geometry of the layout of the cells when manufactured.

In some aspects, each cell may be connected to a data input line which is not connected to any other cell in the same word, and where the data input line supplies a data value when the input select line activates the input transistors of the word such that the voltage and charge level on C1 of each cell may be set to the level provided by each data input line. In some cases, the read select mechanism operates for all cells in a word to activate or deactivate all the cells in that word.

FIGS. 9A, 9B, 9C, and 9D illustrate different views 900-*a* through 900-*d* of a planar multi-level memory cell 900. The planar multi-level cell may include one or more aspects of cells 500, 600, and/or 700, and/or partial array 800, descried above in reference to FIGS. 5-8.

Different views 900-*a* through 900-*d* illustrate one method of construction that is substantially planar, with trenched capacitors. Views 900-*a* through 900-*d* illustrate a fragment of a memory array with 4 cells in a planar layout, with each view 900-*a* through 900-*d* representing a different layer in a process for forming the memory cell 900. It should be appreciated that in some aspects, elements may be added to the array in a different order. The elements are composed in different vertical layers which intersect only at selected locations, otherwise crossing over at their various layers without touching. This planar cell 900 may be formed using some of the processes used for currently existing DRAM cells, with the addition of the sense transistor and output word and cell lines. It should further be appreciated that the various components of multi-level memory cell 900, including their shapes, arrangement, sizes, and relative position are only given by way of example.

In some aspects, the elements are built up in layers with the first layer or layers formed into the surface of a crystalline semiconductor. As known in the art, various structures are typically etched into the silicon of a chip, including buried oxides, channels of silicon, gates, oxide barriers, ions implanted, channels cut, etc. Forming or etching all or part of one or more transistors (for example, low-leakage or high performance FET channels) in the base layer may be beneficial to provide higher performance, accuracy, etc. Whereas, in some cases, levels formed above the chip may generally have temperature restrictions (so as not to damage things already formed lower down) which are below what is needed to anneal large crystals. As such, the upper layers may generally use metals, or polysilicon (poly-crystalline, which means a jumble of partial crystals), amorphous silicon (rather rare outside of things like LCD manufacture), special kinds of conductors like titanium nitride which have desirable chemical properties, various dielectrics for insulation or capacitance, etc.

Figure 9A:
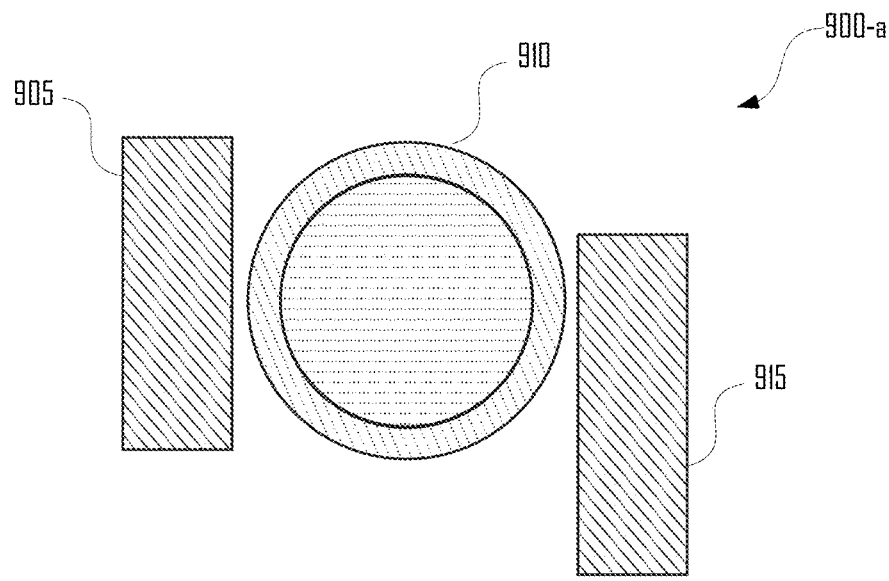
FIG. 9A illustrates a first view or layer of an example planar multi-level gain cell.

As illustrated in FIG. 9A, a sense transistor 905 and an input transistor 915 may be formed as rectangular, square, circular, oval, or other shaped elements substantially parallel to one another with a trench capacitor 910 formed between them.

Figure 9B:
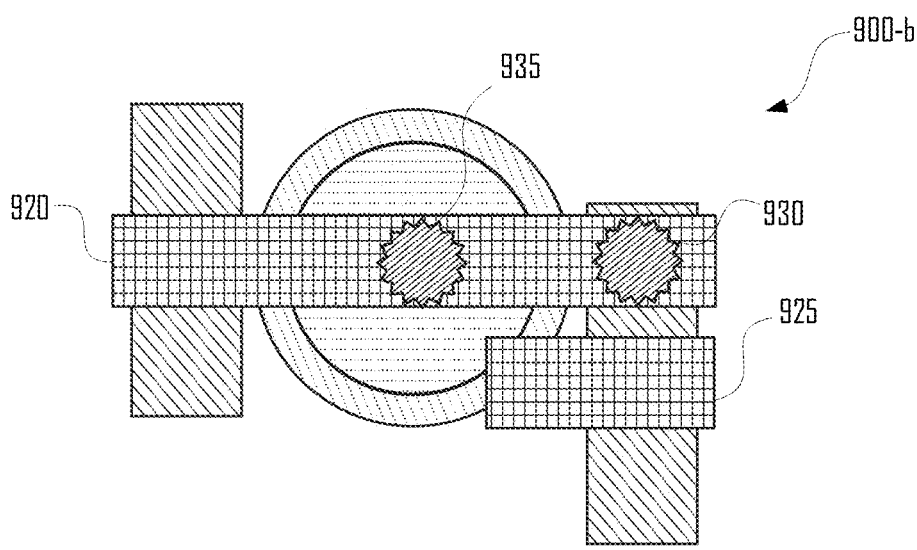
FIG. 9B illustrates a second view or layer of an example planar multi-level gain cell.

Next, as illustrated in FIG. 9B, gate elements, such as sense gate 920 and input gate 925, may be formed substantially perpendicular to and on top of transistors 905 and 915. Sense gate 920 and input gate 925 may be are separated from the surface by a thin insulator which allows the gates to modulate transistor channels. Two electrically conductive vias 930 and 935 may connect the sense gate 920 to the input transistor 915 and the trench capacitor 910, respectively.

Figure 9C:
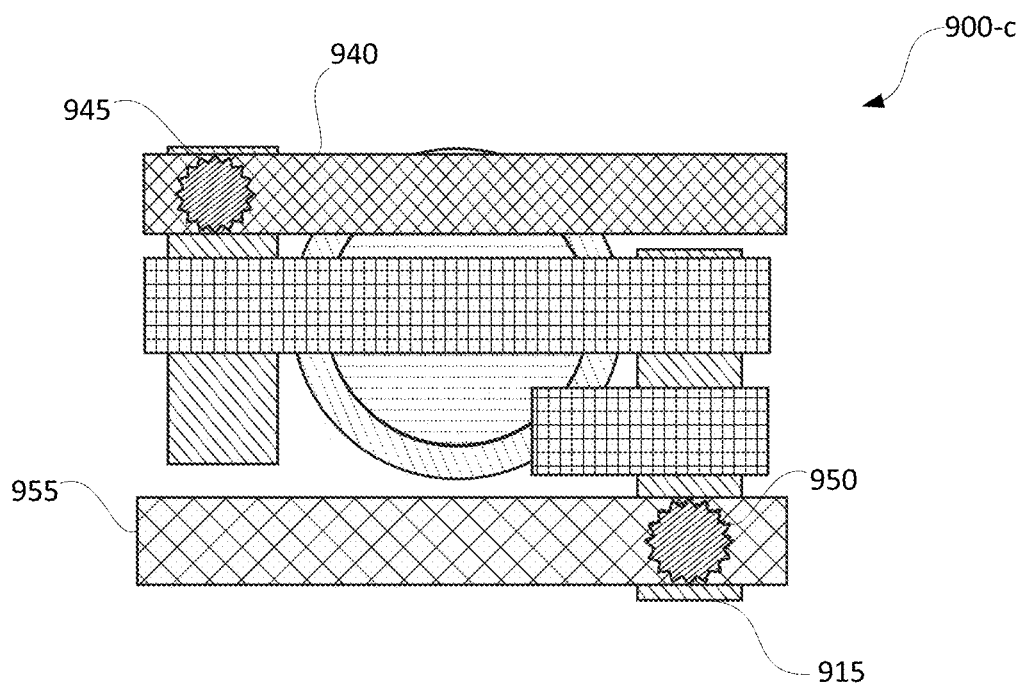
FIG. 9C illustrates a third view or layer of an example planar multi-level gain cell.
Figure 9D:
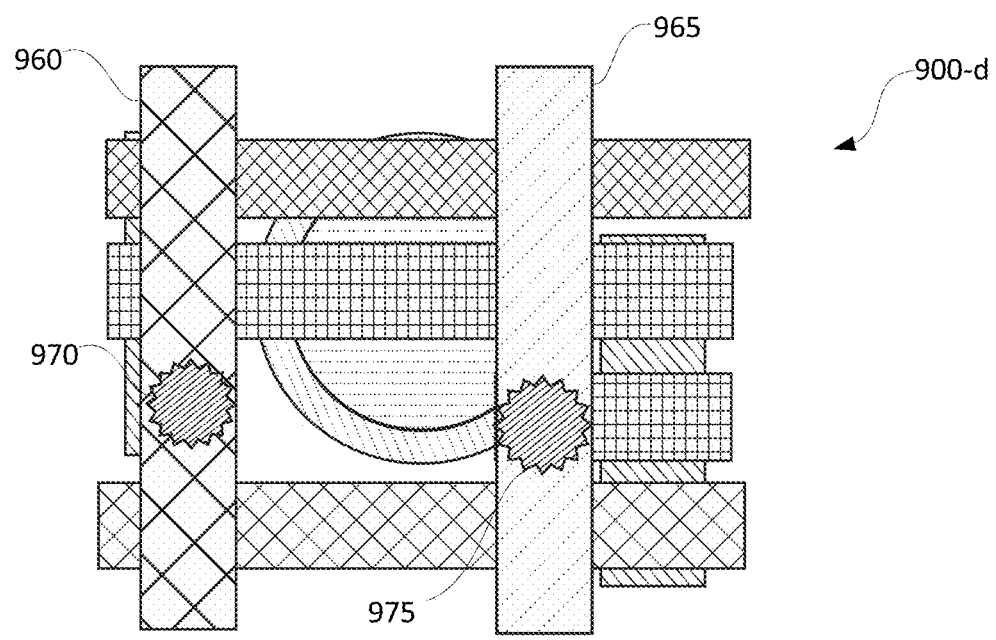
FIG. 9D illustrates a fourth view or layer of an example planar multi-level gain cell.

As illustrated in FIG. 9C, cell lines 940 and 955 are formed substantially perpendicular to and crossing transistors 905 and 915. Cell line out 940 is connected via an electrically conducting via 945 to sense transistor 905. Cell line in 955 is connected via an electrically conducting via 950 to input transistor 915. Insulation (not shown) is added above the cell line wiring layer. Next, as illustrated in FIG. 9D, word line out 960 and word line in 965 are formed substantial perpendicular to and on top of the cell lines 945, 955. Word line out 960 is connected via an electrically conducting via 970 to sense transistor 905. Word line in 965 is connected via an electrically conducting via 975 to input gate 925. Insulation (not shown) is added above the word line wiring layer.

The different oriented layers are separated by insulation so as not to interfere as they cross. Electrical contact between the layers is provided by vias, which are vertical plugs of conductor which pass through the insulation layers. It should be appreciated that the arrangement, construction, and process for forming cell 900 is only given by way of example. Different variations and arrangements of the different elements of cell 900 may be arranged differently, formed on different layers, formed of different shapes, formed in a different order, and separated by different distances based on various design factors, including space constraints, material conductivity, insulating and other properties of the insulators used, etc. In some aspects, the layout of cell 900 may be influenced or changed by design rules for the process or lithography, cost tradeoffs in kind and number of masks, costs of different choices for chemical processes, and the variations of these factors which may be chosen to satisfy other elements on the chip to which the memory cells need to conform.

Figure 10:
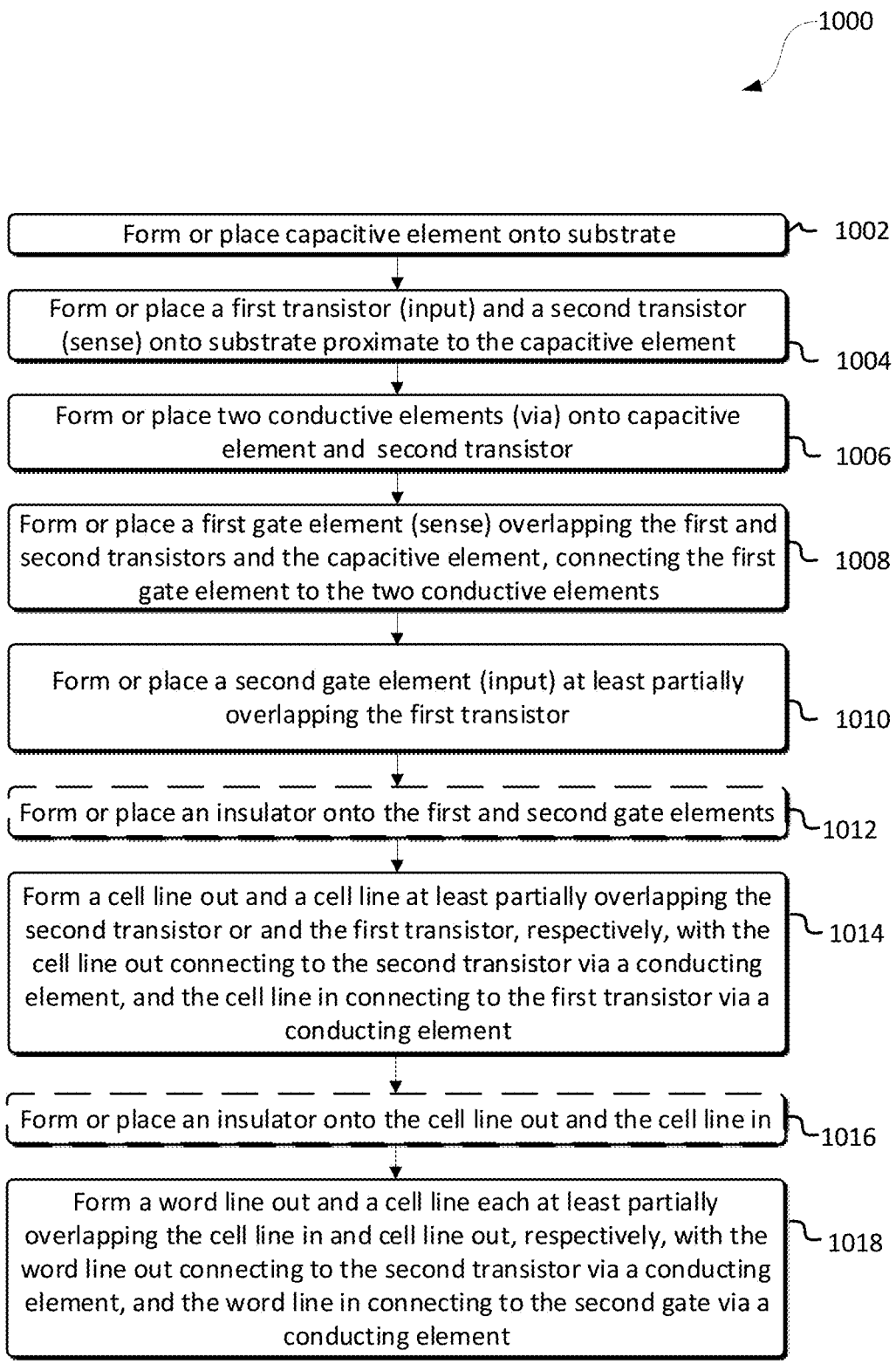
FIG. 10 illustrates an example process for forming a planar multi-level gain cell, such as the multi-level gain cell of FIGS. 9A, 9B, 9C, and 9D.
Figure 11A:
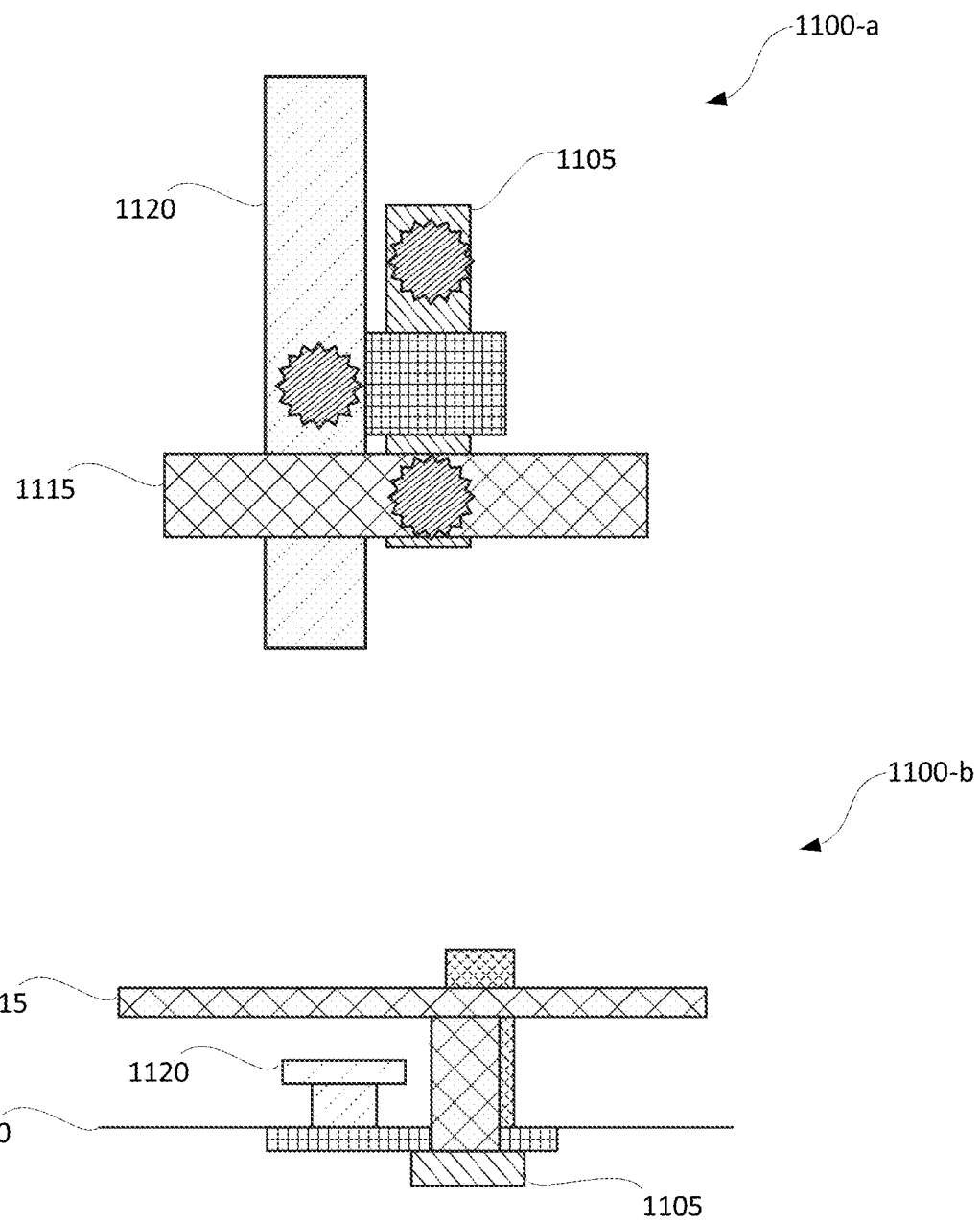
FIG. 11A illustrates two views of a first layer of an example vertical multi-level gain cell.
Figure 11B:
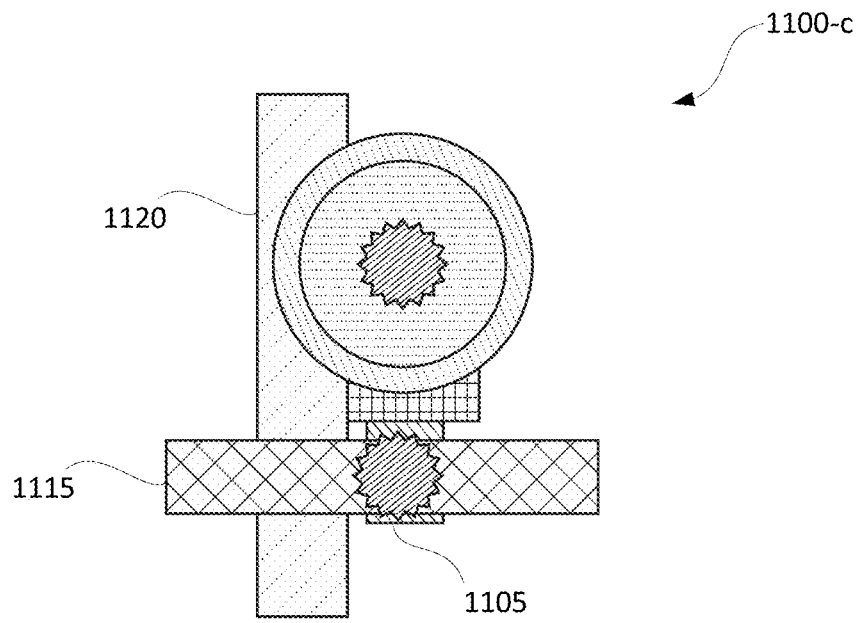
FIG. 11B illustrates two views of a second layer of an example vertical multi-level gain cell.
Figure 11B:
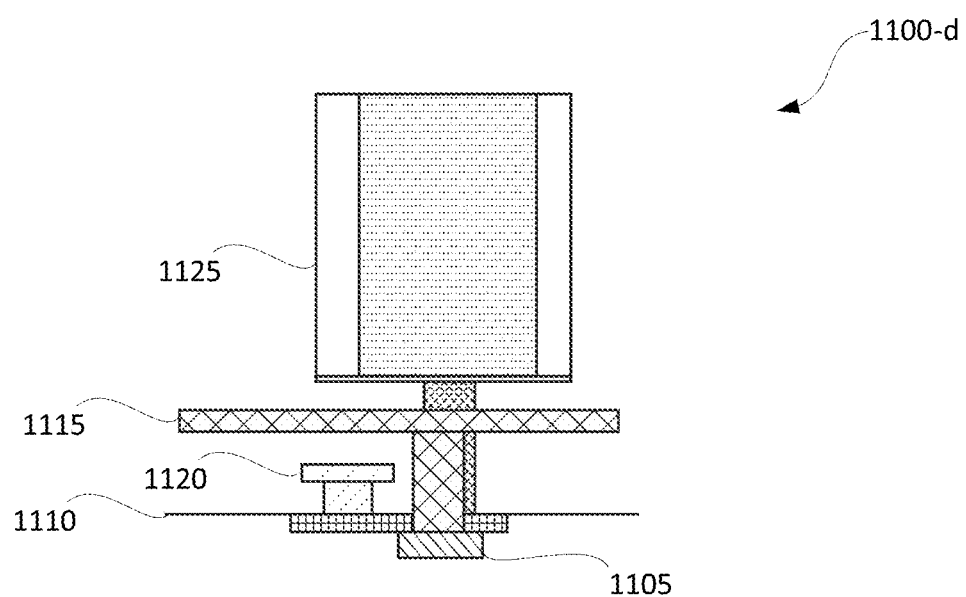
Figure 11C:
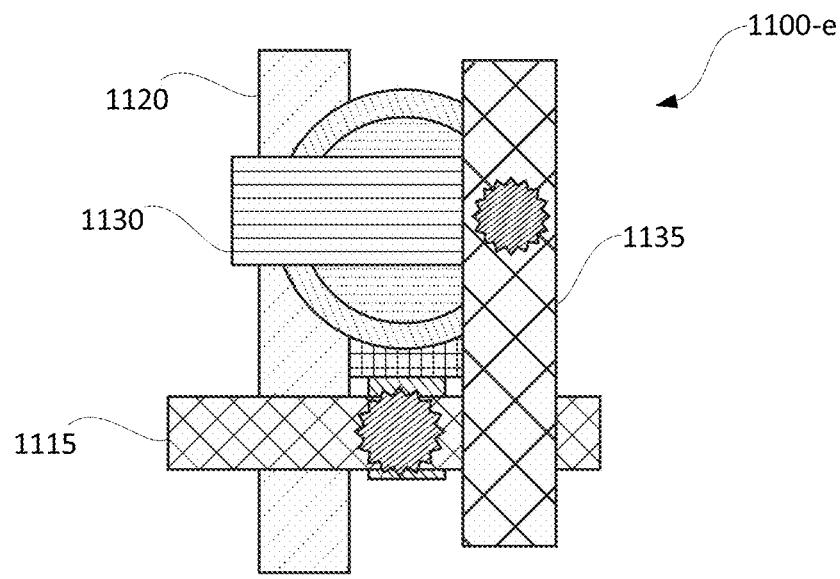
FIG. 11C illustrates two views of a third layer of an example vertical multi-level gain cell.
Figure 11C:
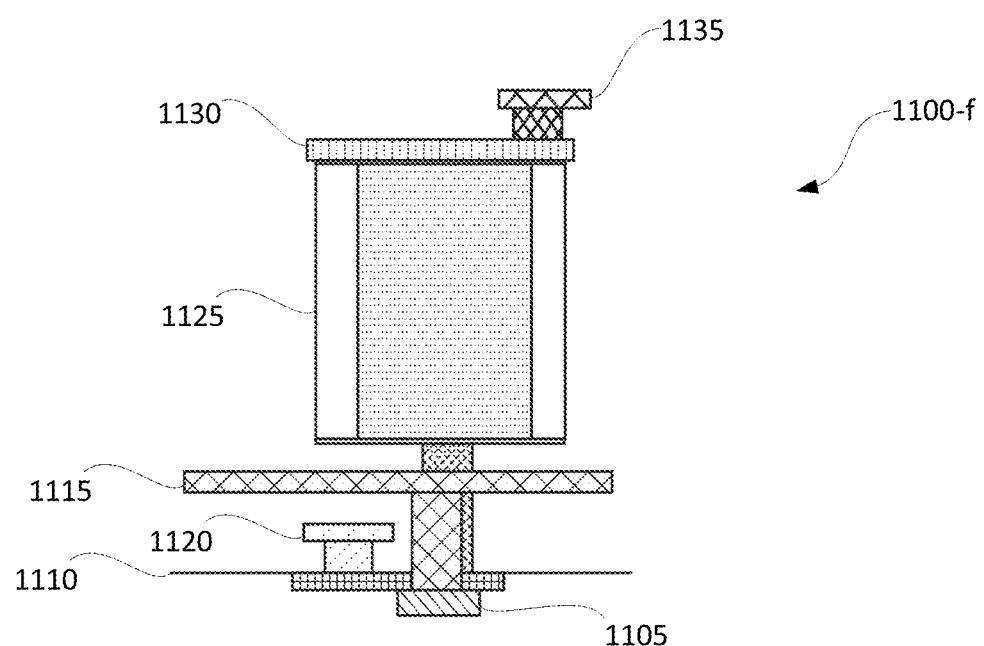
Figure 11D:
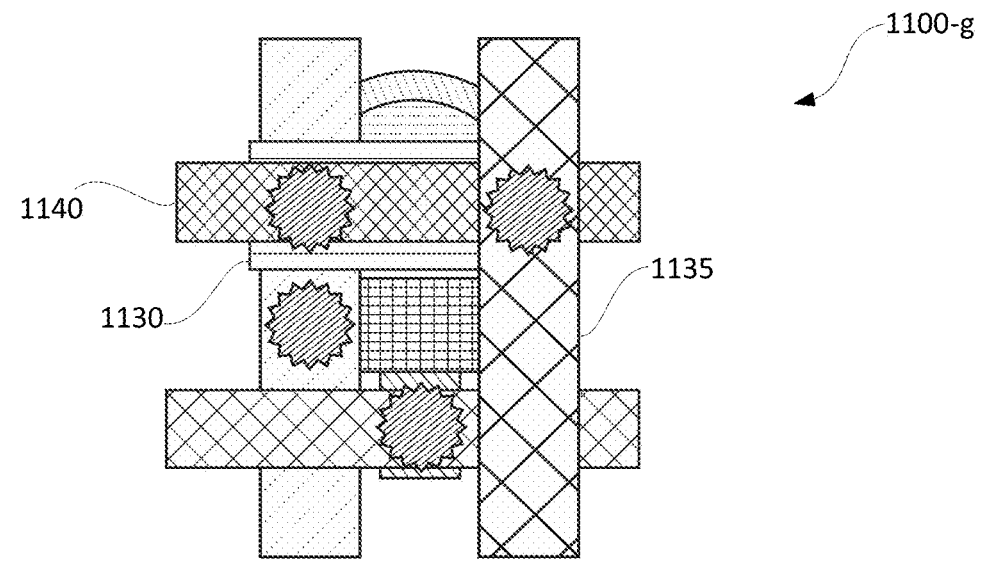
FIG. 11D illustrates two views of a fourth layer of an example vertical multi-level gain cell.
Figure 11D:
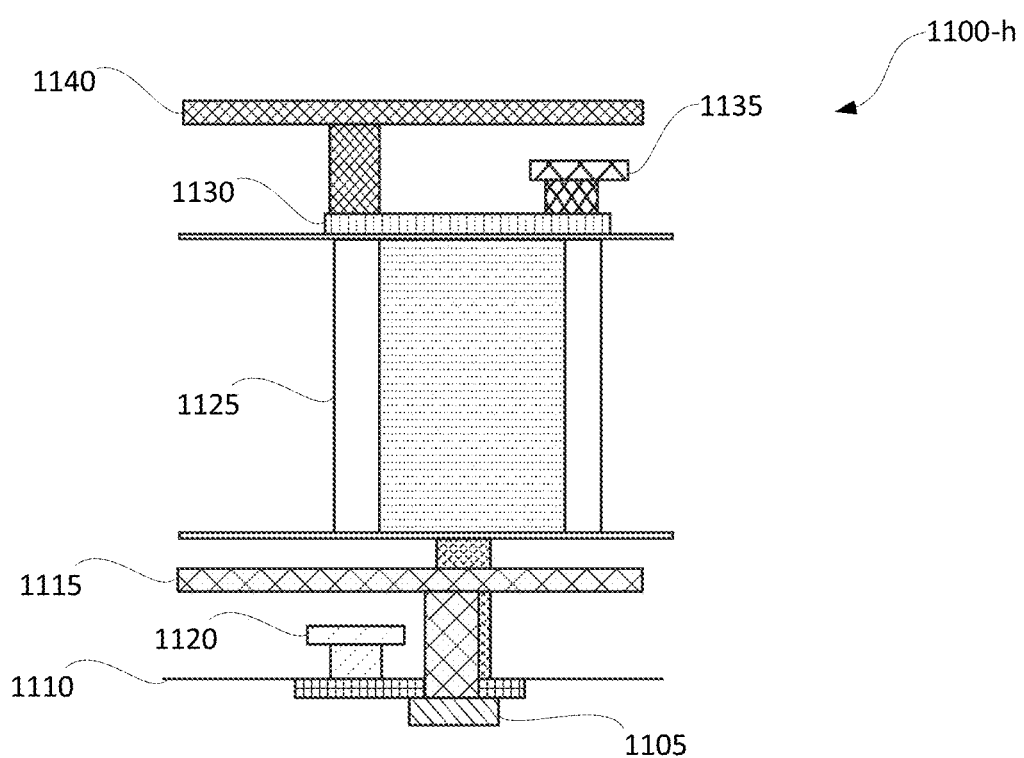

FIG. 10 illustrates an example process 1000 for forming one or an array of memory cells, such as the array described above in reference to FIGS. 9A-9D. In some aspects process 1000 may be used and/or modified to form one or more of cells 500, 600, 700, 800, and/or 900 described above. It should be appreciated that process 1000 is only given by way of example. The memory cells described herein may be formed or manufactured according to various different processes. Accordingly, the addition, modification, change in order, or omission of one or more operations of process 1000 are contemplated herein. In FIG. 10, operations having a dashed line outline or box may represent optional operations, such that process 1000 may be performed with or without those indicated operations.

Process 1000 may begin with operation 1002, where a capacitive element may be formed or placed onto a substrate material. Next, at operation 1004, a first or input transistor and a second or sense transistor, or a portion thereof, may be formed or placed on the substrate proximate to the capacitive element. At operation 1006, two conductive elements or vias may be formed or placed onto the second transistor and the capacitive element, respectively. Next, at operation 1008, a first gate element of the second transistor may be formed or placed overlapping the first and second transistors, connecting the first gate element to the two conductive elements. Next, at operation 1010, a second gate element of the first transistor may be formed or placed at least partially overlapping the first transistor. Optionally, at operation 1012, an insulator may be formed or placed onto the first and second gate elements. Next, at operation 1014, a cell line out and a cell line may be formed at least partially overlapping the second transistor or and the first transistor, respectively, with the cell line out connecting to the second transistor via a conducting element, and the cell line in connecting to the first transistor via a conducting element. Optionally, at operation 1016, an insulator may be formed or placed onto the cell line out and the cell line in. Next, at operation 1018, a word line out and a cell line may be formed each at least partially overlapping the cell line in and cell line out, respectively, with the word line out connecting to the second transistor via a conducting element, and the word line in connecting to the second gate via a conducting element.

It should be appreciated that exemplary process 1000 is directed to forming a single memory cell. As contemplated herein, process 1000 may be modified to accommodate manufacturing a large number of individual cells onto a single chip, such that, for example, forming the same element in multiple different locations on the chip may be performed in a single step, before the next operation is performed.

FIGS. 11A, 11B, 11C, and 11D illustrate different views or layers 1100-*a* through 1100-*d* of a vertical multi-level memory cell 1100. The vertical multi-level cell 1100 may include one or more aspects of cells 500, 600, and/or 700, and/or partial array 800, descried above in reference to FIGS. 5-8.

In some aspects, the described multi-level gain cell may be formed, built, or manufactured in a vertical arrangement. In some cases, this vertical configuration may provide better areal density than the planar cell 900, as described above in reference to FIGS. 9A, 9D, 9C, and 9D. In the vertical multi-level gain cell 1100, the input transistor 1105 is constructed on the planar surface of a semiconductor 1110 which supports a high quality low leakage transistor, as illustrated in top and sides views 1100-*a*, 1100-*b* of FIG. 11A. In some aspects, a cell line in 1115 and a word line in 1120 may be formed or placed adjacent to and in contact with the input transistor 1105. The capacitor structure 1125 may be added on top, as illustrated in top and side views 1100-*c*, 1100-*d* of FIG. 11B. In some aspects, capacitor structure 1125 may include a cylindrical capacitor. However, it should be appreciated that other types and configurations of a capacitive element may be used. The sense transistor 1130 may then be added on top of or at least partially over the capacitor 1125, as illustrated in top and side views 1100-*e*, 1100-*f* of FIG. 11C. In some aspects, the body of capacitor 1125 may directly act as the gate for the sense transistor 1130 where the gate insulator between the gate and the transistor channel is part of the capacitor insulation. The word line out 1135 may be placed or formed along the top of the device stack. The cell line out 1140 may be placed or formed along the top of the device stack, as illustrated in top and side views 1100-*g*, 1100-*h* of FIG. 11D. The sense transistor 1130 added in a top layer in this arrangement may be a lesser quality than in a planar device, such as the described in reference to FIGS. 9A-9D, but still good enough to amplify the cell output and insulated effectively to avoid draining the capacitor 1125.

Figure 12:
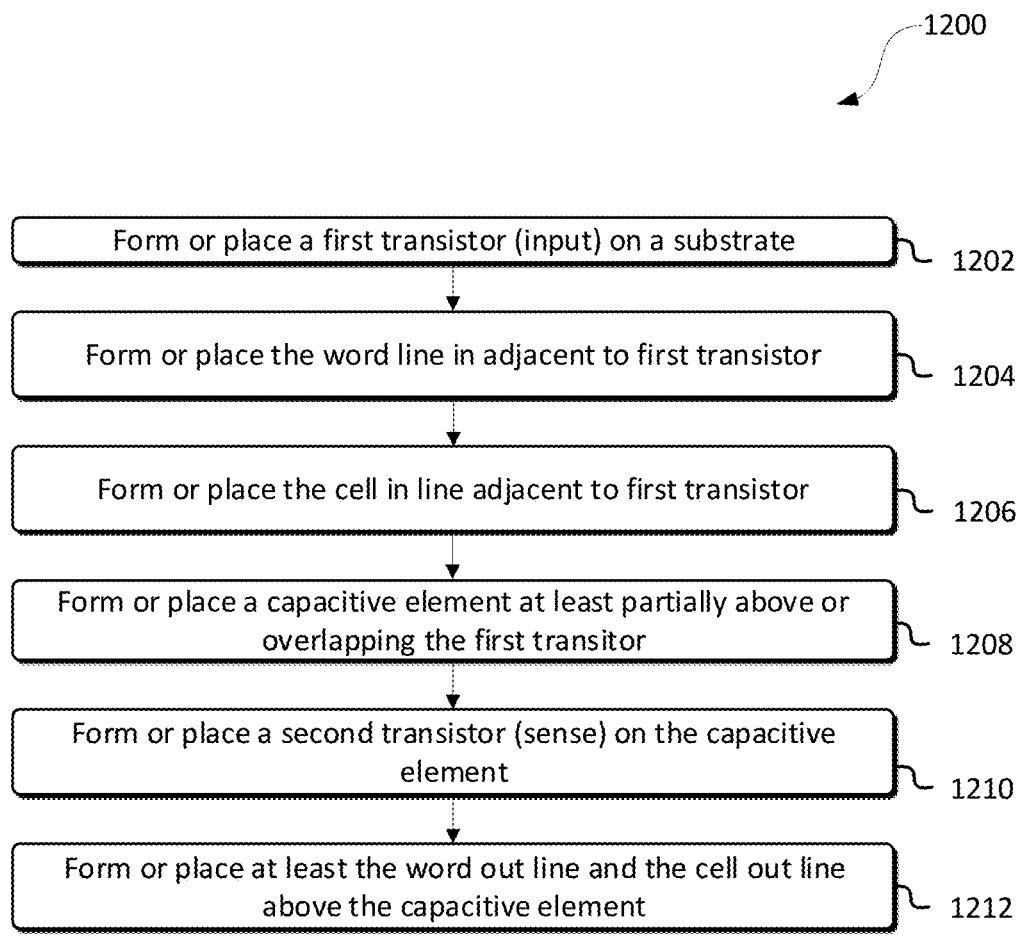
FIG. 12 illustrates an example process for forming a vertical multi-level gain cell, such as the multi-level gain cell of FIGS. 11A, 11B, 11C, and 11D.

FIG. 12 illustrates an example process 1200 for forming one or an array of memory cells, such as the vertical cell described above in reference to FIGS. 11A-11D. In some aspects process 1200 may be used and/or modified to form one or more of cells 500, 600, 700, 800, and/or 1200 described above. It should be appreciated that process 1200 is only given by way of example. The memory cells described herein may be formed or manufactured according to various different processes. Accordingly, the addition, modification, or omission of some operation of process 1200 are contemplated herein. In FIG. 12, operations having a dashed line outline or box may represent optional operations, such that process 1200 may be performed with or without those indicated operations.

Process 1200 may begin with operation 1202, in which a first or input transistor may be formed as part of or placed onto a substrates. Next, at operation 1204 and 1206, a word line in and a cell line in may be formed or placed adjacent to the first transistor. Next, at operation 1208, a capacitive element may be formed or placed at least partially above or overlapping the first transistor. At operation 1210, a second or sense transistor may be formed or placed on or overlapping the capacitive element. Next, at operation 1212, a word line out and a cell line out may be formed or placed above or overlapping the capacitive element.

It should be appreciated that exemplary process 1200 is directed to forming a single memory cell. As contemplated herein, process 1200 may be modified to accommodate manufacturing a large number of individual cells onto a single chip, such that, for example, forming the same element in multiple different locations on the chip may be performed in a single step, before the next operation is performed.

Figure 13:
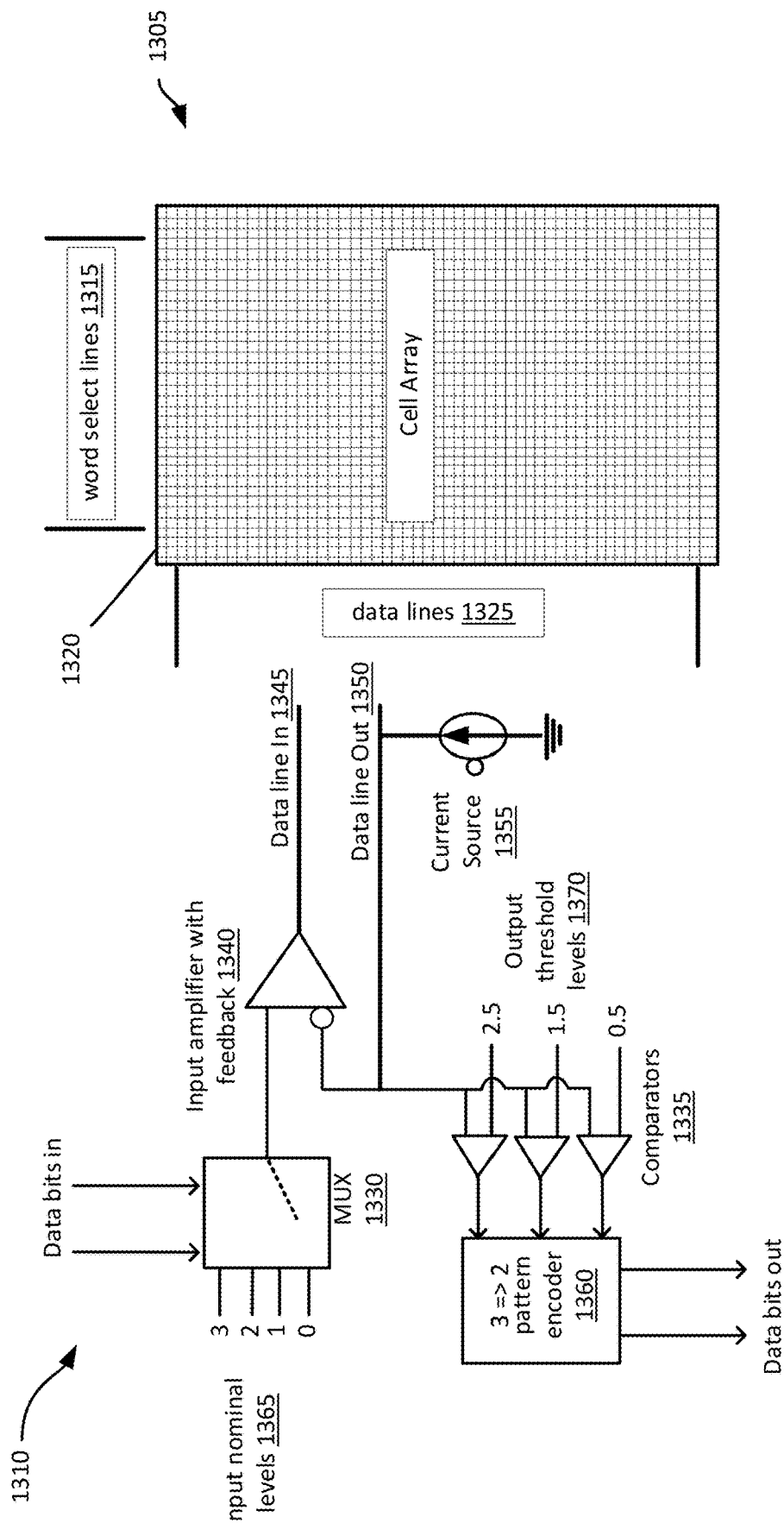
FIG. 13 illustrates an example multi-level gain cell array coupled to a feedback mechanism.

FIG. 13 illustrates an example array of multi-level gain cells 1305 coupled to a feedback mechanism 1310. The array of multi-level gain cells 1305 may include one or more aspects of gains cells 500, 600, and/or 700, and/or arrays 800, 900, and/or 1100. It should be appreciated that the array 1305 may include any number of gain cells. For ease of reference, the interaction between feedback mechanism 1310 and the array of cells 1305 will be described below in reference to elements of gain cell 500. It should be appreciated that a similar operation applies to the other gain cells described herein, including gain cells 600, 700, 800, 900, and/or 1100.

While an open loop source follower cell may provide enough quality to support multiple levels with a relatively large capacitor in a small array, statistical variation in levels, leakage, and supporting elements may all combine to limit the size of the array and the number of levels. In order increase accuracy and reduce variation, one or more features may be added or combined with the array, as will be described below.

A feedback mechanism 1310 may be implemented where the word line for output is selected at the same time as the word line for input (not shown), enabling the cell output to be sensed at the same time as charge is put in. This feedback mechanism or loop 1310 may include all aspects of the word line out (e.g., 535 of FIG. 5), the sense transistor (e.g., 510 of FIG. 5), and the cell line out (e.g., 540 of FIG. 5), as described above for a cell, so that variations will be included and compensated inside the loop when setting the value of charge in the cell to a value that causes the desired output (e.g., one of multiple values).

There are separate word lines 1315 for input (writing) and sensing (reading) on each word (column) of cells 1320. Control circuits (not shown) on the word lines 1315 will choose at most one input word line to match data being written, and at most one output word line to match data being read. When reading, the word lines 1315 for write should be inactive. When writing, the word line 1315 for both read and write will be active on the same word so the cell is in a feedback loop for accurate charging.

In some aspects, the feedback mechanism 1310 may include a dedicated adjacent set of read and write circuits. As described in more detail below, there are other arrangements, but feedback mechanism 1310 demonstrates the basic operation. Feedback mechanism 1310 includes four levels (2 bits) per cell. However, it should be appreciated that the count of levels may be any integer 2 or greater, and does not need to be a power of 2. Various coding schemes can be used in combination with any integer to optimize the capacity and reliability of the device.

Feedback mechanism 1310 includes a MUX 1330, an encoder 1360, and comparators 1335 for digital to analog and analog to digital converters, respectively. Other forms of D/A and A/D converters may be used for either or both functions. The MUX 1330, encoder 1360, and comparators 1335 facilitate flexible adjustments to the threshold levels for both input 1365 and output 1370 to adjust for variations in operation. The circuits needed for each data line 1325 are simple to arrange and replicate at the necessary accuracy.

The operation of reading from a cell will now be described. If there are cells which already have been set to specific data levels, then a word of those cells may be read by selecting the read select line for that word which activates read operation of every cell in one word of the array. Each such cell is connected to one data out line 1350. The data out line 1350 has a current source 1355 which is matched to the amount of current that T2 (e.g., 510 of FIG. 5) should pass in source follower mode. The current source 1355 may be a simple resistor, but a constant current source will allow the T2 to follow the voltage on C1 (e.g., 515 of FIG. 5) with better linearity, and it will also make the resistance of the data line less consequential, while also allowing operation at a lower maximum current than a resistor would permit for the same quality of signal. The resulting voltage, which is set by T2 tracking the voltage on C1, is fed into the A/D conversion, such as a set of comparators 1335 linked to thresholds between the nominal values. The result will be converted to a digital readout of the value in the cell. The input D/A (e.g., MUX 1330) and tracking amplifier 1340 may be idled to save power.

The operation of writing to one or more cells will now be described. To write to a word of cells, that same word is also read. In this operation, the A/D converter is not needed, and may be idled to save power. Both the write select and read select lines will be activated for the desired word. The D/A converter is used to generate a desired nominal level, and the tracking amplifier 1340 is enabled. The tracking amplifier 1340 will drive charge via the data input line 1345 through T1 (e.g., 505 of FIG. 5) in the cell, which is enabled by the write select line, and there into the capacitor C1 (e.g., 515 of FIG. 5). As the capacitor charges its voltage changes, and T2 (e.g., 510 of FIG. 5) will follow that voltage. Since the cell is also read enabled, the source follower output of T2 on the data output line 1350 returns to the negative feedback input of the tracking amplifier 1340. This negative feedback allows the value placed on C1 to be whatever is needed to match the desired nominal voltage, compensating for variations in the circuits. This feedback enables practical storage of multi-level data into DRAM cells.

The feedback mechanism 1310 may provide additional benefits and advantages, such as enabling writing operations to use a more aggressive voltage profile. There is an inherent conflict in the design of the input transistor (e.g., T1) where the ratio of on and off currents limits the refresh time. For example, if T1 carries 10,000 times more current when active than when off, and if the time to charge the capacitor with T1 on is 10 nanoseconds, then the discharge time due to leakage will be on the order of 100 microseconds. This ratio may be enhanced if the drive amplifier is using a higher voltage differential across T1 until the capacitor is nearly charged. This may allow a lower leakage transistor design to be used while still setting the capacitor level in a short time.

In some aspects, each memory cell may be activated for reading at the same time as activated for writing, and a differential amplifier may use negative feedback from the read value to drive the data input to each cell through its active input T1 to set the accurate charge level on C1. The level set of C1 is tracked by activated T2 and reported out on the data output line connected to the negative feedback of the amplifier. This implementation of the feedback loop 1310 may be designed to avoid oscillation and properly converge to matching the ideal reported read voltage desired for each cell.

Figure 14:
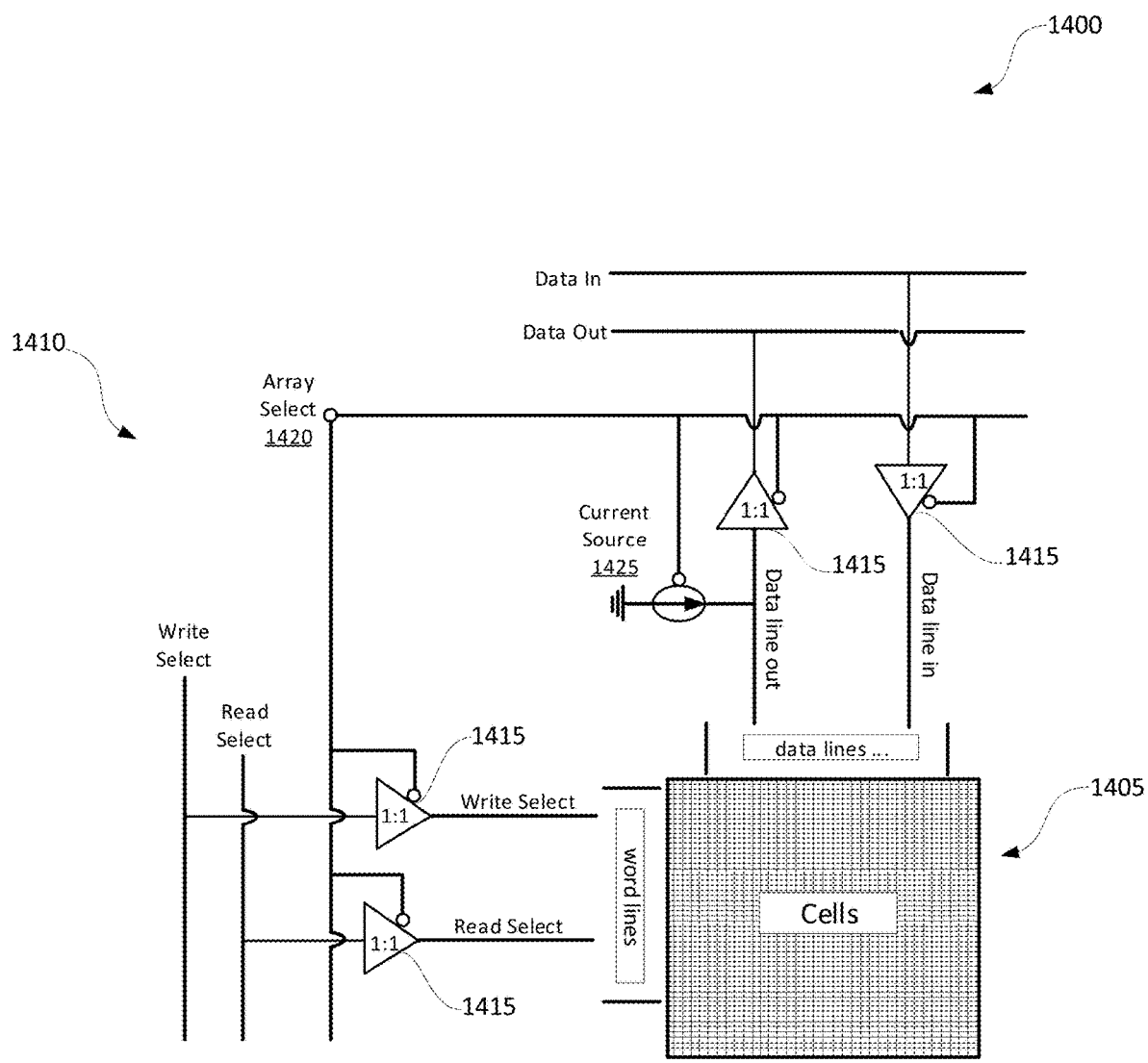
FIG. 14 illustrates an example multi-value gain cell array with shared control circuitry.

FIG. 14 illustrates an example array of multi-value gain cells 1405 with shared control circuits or relays 1410. In some cases, the control circuitry 1410 may be large relative to cell array 1405. If complex data input and output are needed on every line for every array, then the ratio of silicon available for storage cells may be low. In this scenario, it may be beneficial to share one set of data input and output circuits over multiple arrays. The arrays can be configured at an ideal size, and the read and write circuitry may be shared among multiple arrays. In some aspects, 1:1 voltage gain buffer amplifiers 1415 may be used in both directions, which relay their signal to or from the main read and write circuitry (not shown). These buffers 1415 may be powered on for the array which contains the currently used word line via an array select control or switch 1420, with other arrays not powered on. Accurate 1:1 amplifiers for these small loads are fairly easy to make and are quite small. With this example design, the overheads per array may be minimized while sharing the sophisticated read and write circuitry over a large number of cells, thus increasing the ratio of the chip which may be storage cells.

In some cases, the relay circuits fall within the feedback loop when writing, so their effects are mostly cancelled out allowing accurate values to be placed on any capacitor of a large chip.

The current source 1425 at the relay level may either eliminate the need for a current source at the input cells, or it may shunt or mirror the current sources. A shunt or mirror in the relay may give accurate current with minimal overhead per array while permitting space for an accurate design overall.

In some aspects, the relay circuits may be designed to be idle unless enabled, so only a few arrays are selected to be active (in general, one array per set of 10 circuits) and the rest of the chip is idle, conserving power.

In some aspects, where the cells are organized into arrays with words comprised of multiple cells, each cell is connected via a data input line to distinct device for writing an ideal value into one cell at a time, and each cell is connected via a data output line to a device for reading the output signal and comparing it to one or more threshold values for deciding which of several levels the signal is reporting. In some aspects, multiple relays may be utilized, one for each separate array. The relays may all connect to the same distant set of input and output circuits, with each relay individually selectable. In some cases, one or more spare relays may be provided.

Figure 15:
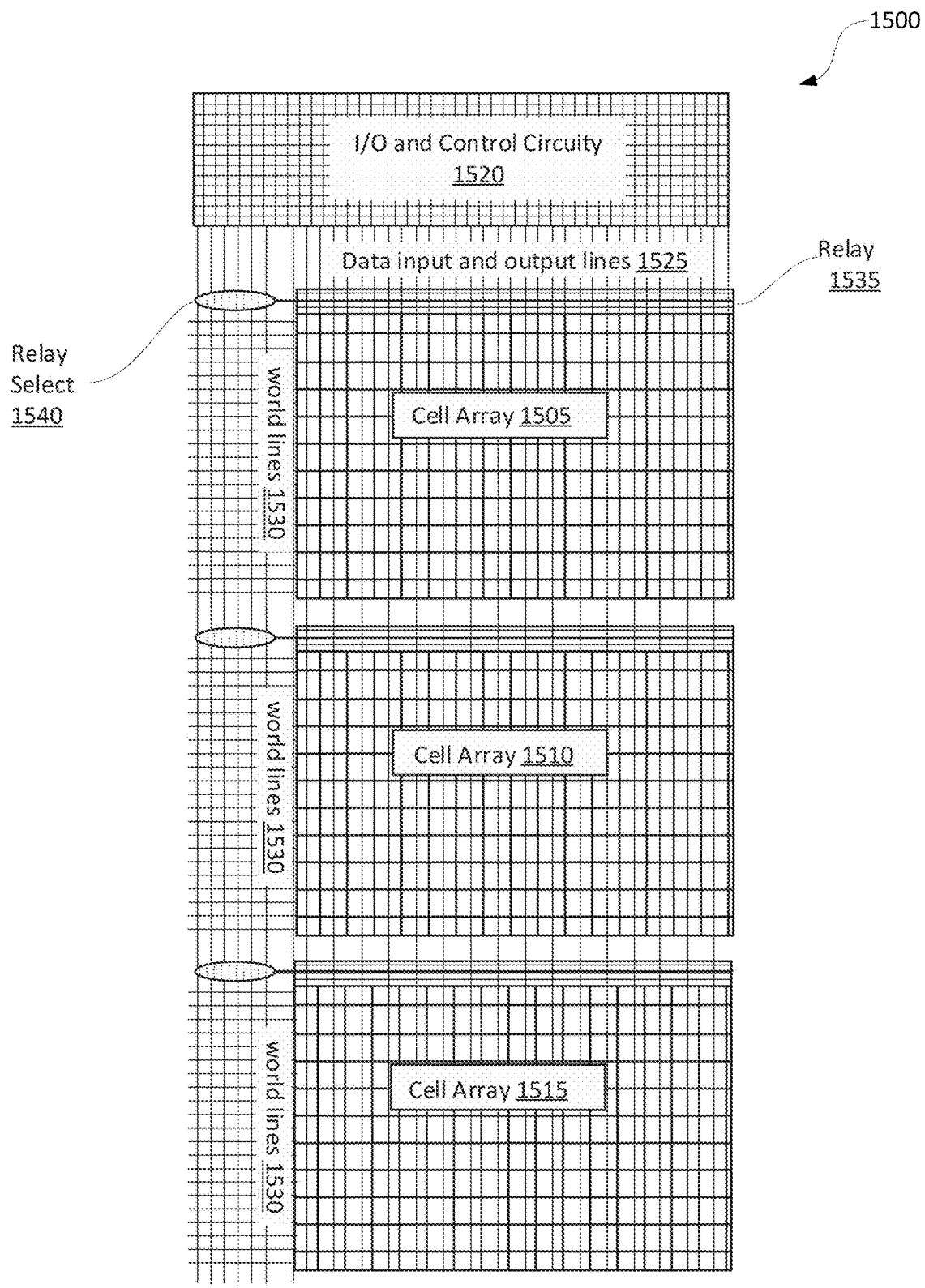
FIG. 15 illustrates a memory system with a redundancy mechanism.

FIG. 15 illustrates an example memory system 1500 including two functional arrays 1505 and 1510, and a redundant array 1515. Array 1500 may include I/O and control circuitry 1520, which may implement input and output functionality via data input and output lines 1525, word lines 1530, may collect and use values, and perform error correction, among a number of other different functions. In some aspects, it may be desirable to use redundancy to improve quality and reduce the proportion of failures in manufacture, particularly in the manufacture of memory devices. Using a relay system, such as relay system 1400 described above, may provide desirable redundancy without huge complexity. In the example illustrated, relays 1535 for each array may interface with relay select lines 1540 and perform address decoding functionality to enable reading and writing to select cells and words.

In the example illustrated, if it is expected that 2 arrays will function, then the third array may be a spare to be selected if one of those fails. This idea may be extended to more arrays and more spares. The number of redundant memory arrays may be determined based on an expected rate of failure of manufactured devices, or based on a number of other considerations, such as desired or mandated performance criteria, and the like.

Figure 16:
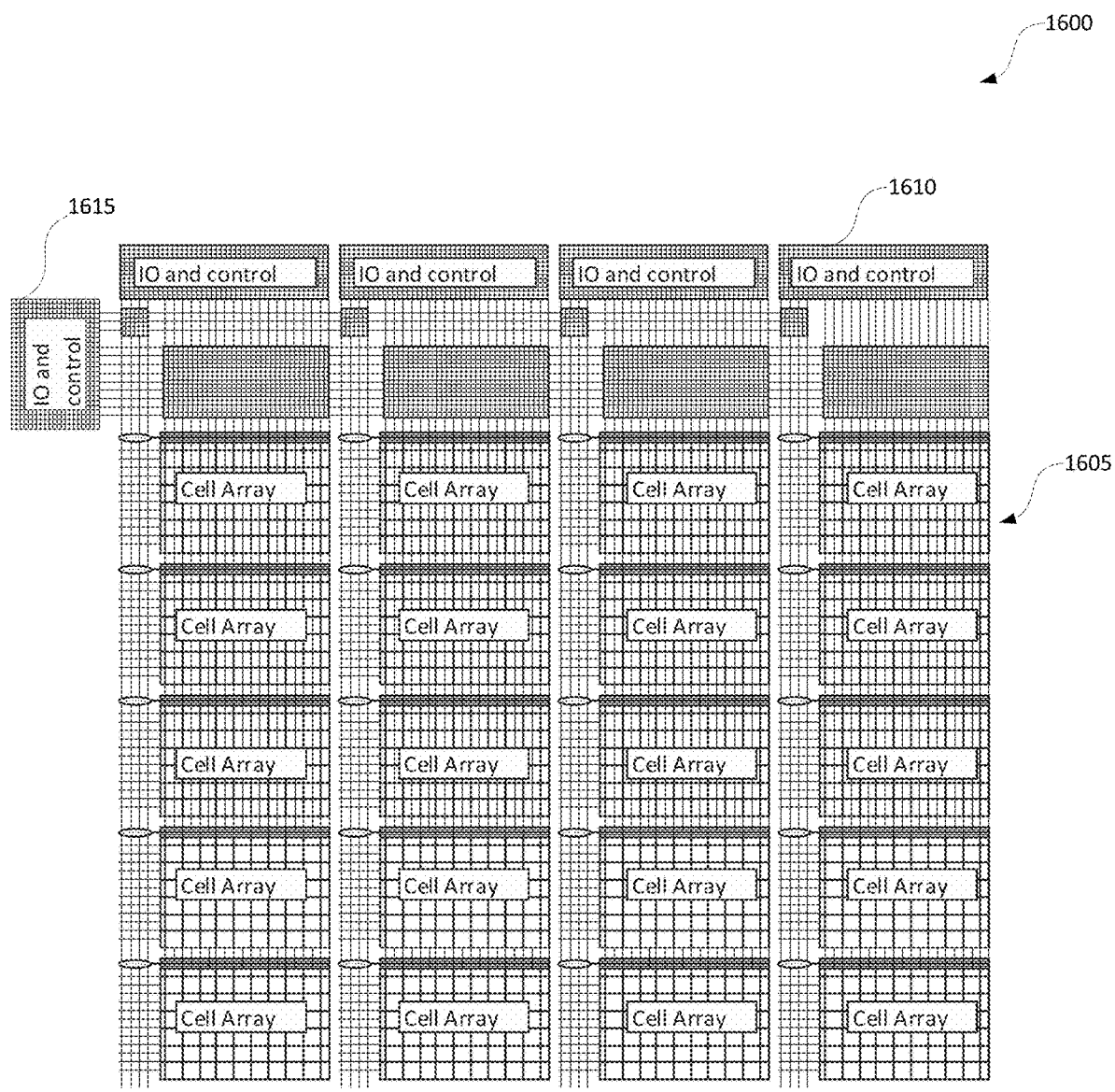
FIG. 16 illustrates a memory system with a second redundancy mechanism.

FIG. 16 illustrates an example memory system 1600 including multiple cell arrays 1605 and multiple I/O and control circuits or blocks 1610. In some aspects, redundancy of the array can be improved further using a more completely assignable scheme mapping between arrays and input/output circuits.

For example, a spare 10 and Control block 1615 may be added and mapped in when needed. This level of redundancy may be weighed against space constraints and added manufacturing costs to see if the extra multiplexing circuitry and area will deliver an overall increase in reliability and yield.

It should be appreciated that system 1600 is not drawn to scale. For example if each array holds 4 MB of data, a whole chip may have 1024 or more arrays, and the proportional size of the IO and Control blocks will change too. The real-device tradeoffs may be different than they appear in FIG. 16.

Figure 17:
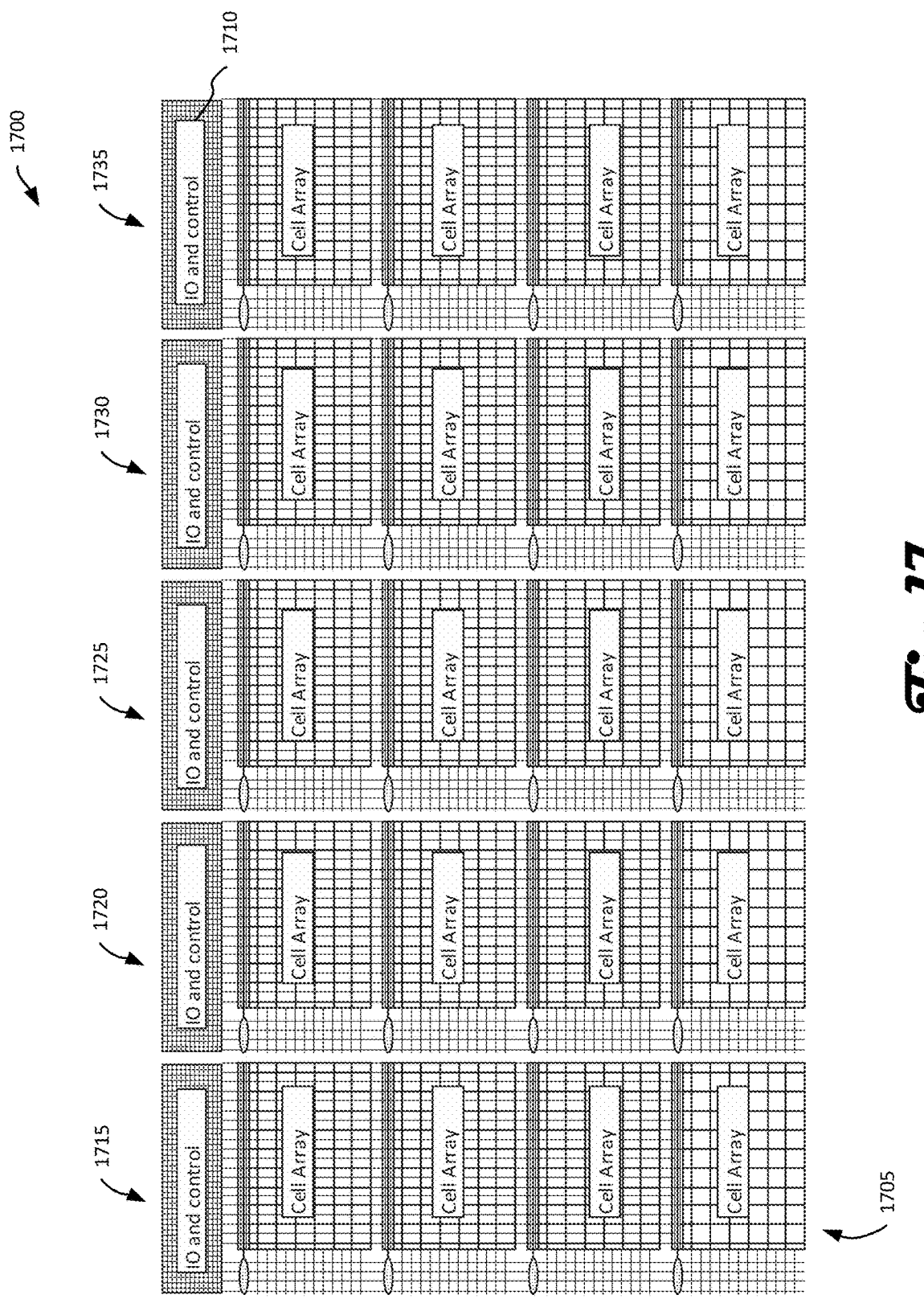
FIG. 17 illustrates a memory system with a third redundancy mechanism.

FIG. 17 illustrates an example memory system 1700 including multiple cell arrays 1705 and multiple I/O and control circuits or blocks 1710. Another approach to redundancy is to spare a column instead of (or in addition to) sparing an array per column. This is in some ways simpler than providing an N+1 pathway to a spare controller, such as the example described in reference to FIG. 16. If it is done instead of spare arrays, then the yield and reliability may be slightly lower since more than 1 faulty array is unlikely to be handled, but it does cover failures anywhere in one column.

In this example, the entire column redundancy system may be represented by a chip that only uses 4 columns, 1715, 1720, 1725, 1730, with the 5th column 1735 available as a spare.

It should be appreciated that the type of redundancy system implemented, including systems 1500, 1600, and 1700, may provide distinct benefits, such that implementation of one or combination thereof will be driven by design choices and constraints. In some aspects, the individual words will be implemented with extra cells for redundancy and error correction, so the cell arrays will be fairly robust. It should also be appreciated that the device using the memory may itself have a capability to map and avoid bad arrays. This factor may lead to so optimizing the memory for the total number of arrays which hold data and not to use the chip itself to provide redundant capacity which is not normally usable. The described relay system is compatible with all of these implementations.

Figure 18:
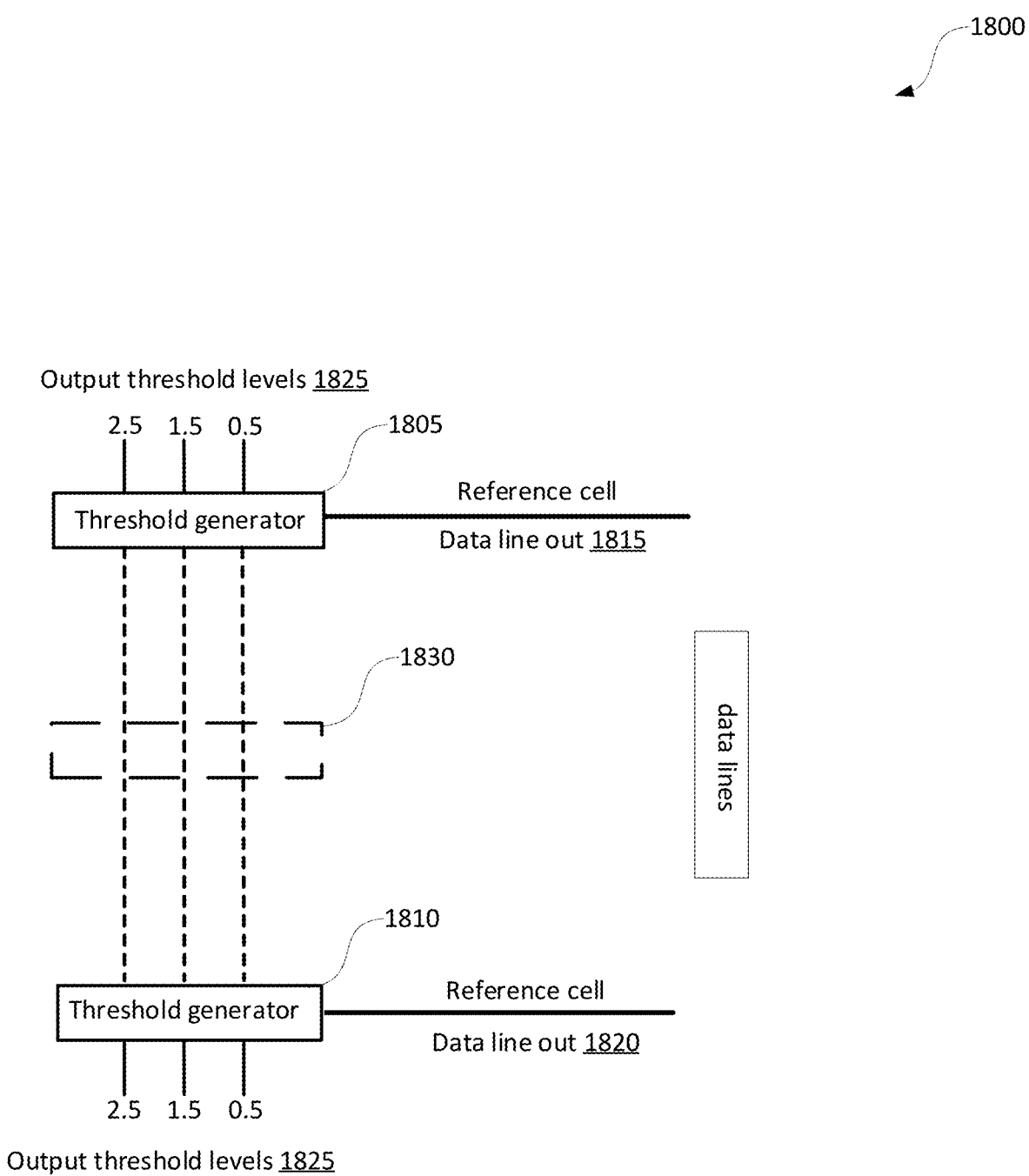
FIG. 18 illustrates an example reference cell subsystem of a multi-level gain cell array.

FIG. 18 illustrates an example system 1800 for implementing reference cells in an array, such as one or more of the arrays described above. The causes of variation in circuit performance tend to be similar over short distances on modern semiconductor devices. As such, it may be beneficial to include regular extra cells that are set to a known reference level to estimate the most likely drift behavior on neighboring cells which hold actual data values. If reference cells are at intervals in every word and are programmed with their level at the same time as the data cells in that word, then they will provide a reference behavior which follows the same time pattern as the data in the word. These reference cells may be used to modify the threshold levels (e.g., illustrated as 2.5, 1.5 and 0.5 volts) used when reading out the cells to allow improvements to accuracy of level sensing, and provide for longer intervals between data refresh operations.

In some embodiments, these reference or dummy cells may be included at regular intervals amongst the data. These cells may be written the same as data cells and with the same feedback to obtain the same accuracy, but instead of data they are written with specially chosen reference values. In some cases, different dummy cells may have different reference values. For example, there may be dummy cells representing the most negative and most positive values, or any values in between, on the capacitance, to observe the variations at specific reference values. The dummy cells may be written at the same time as data cells so they follow the same context both on length of time and on correlation to local process variations. These reference values may flow through the same readout chain as the data values, but for purposes of reading, they will be used to drive threshold generator circuits. These circuits supply the threshold levels used to distinguish the value levels returned from data cells. A threshold generator may take as input the standard values and the observed drift in one or more dummy cells to generate the most likely correct threshold values. These values can then be used in the analog to digital conversion of data values from cells near or proximate to the dummy cells. In some cases, the decisions about the values of the data cells may be delayed to allow the settled values of the references to propagate their full effect.

In some cases, a refresh cycle may use a read, resolve the read into clear data values, optionally apply error correction, and then another cycle to write the value back, with the feedback in use to renew an accurate cell value. To ensure accurate threshold values are obtained, the reference values in dummy cells may be written whenever data is written, including the writeback part of a refresh cycle.

Extra cells in an array may be used as threshold generators. As illustrated, threshold generators 1805 and 1810 may each output differing values, for example, measured against key points or threshold levels 1825, such as 2.5, 1.5, and 0.5 volts. These values may be read out via the data line out 1815, 1820 for each threshold generator/reference cell 1805, 1810. Cells located physically in between the threshold generator cells 1805 and 1810, such as reference cell 1830, may have their values compared and/or changed based on their distance from one or both of threshold generators 1805, 1810. It should be appreciated, that in practice, a cell's 1830 output voltage may be compared to any number of threshold generators 1805, 1810 in the same array, chip, etc., to provide a more accurate threshold value to which to compare to determine a bit or digital value.

In some aspects, the threshold generator levels may blend information from neighboring reference lines, and adjusted values will smoothly transition in the region between. In some aspects, values may be blended by averaging. In some aspects, a string of resistive elements may be implemented between threshold generators with taps at each cell in between. In yet some embodiments, the higher of two or more values of threshold generators may be selected, to overcome issues with faulty reference values.

It should be noted that data line A/D conversion may be slightly delayed to allow the threshold generators to reach stable adjustment.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

What is claimed is:

1. A dynamic memory cell comprising: a first transistor, disposed on a substrate, connected to a data input line and controlled by a word input select line coupled to a gate of the first transistor, wherein the first transistor having a low leakage through a channel of the first transistor when the gate is not selected; a capacitive element coupled to the first transistor, wherein the capacitive element stores two or more values, each of the two or more values corresponding to one of multiple voltage levels; a second transistor coupled to the capacitive element, wherein the charge on the capacitive element controls operation of the second transistor via a gate of the second transistor; a data output line connected to the source of the second transistor, wherein the second transistor operates in source-follower mode to enable the multiple voltage levels to be accessed via the source of the second transistor from the capacitive element; and a word read select line connected to the drain of the second transistor, wherein current flows through the second transistor when the word read select mechanism is activated to access the one or more values, represented by the multiple voltage levels, stored in the dynamic memory, cell and wherein the word read select line further comprises a third transistor directly connected to the drain of the second transistor.

2. The dynamic memory cell of claim 1, wherein the capacitive element is configured to hold any of multiple different voltage levels, wherein each of the multiple different voltage levels representing at least one bit of information.

3. The dynamic memory cell of claim 1, wherein the dynamic memory cell further comprises a load on the word read select line which passes current in the forward direction, and wherein a voltage on the data output line substantially linearly tracks a voltage created by the charge on the capacitive element.

4. The dynamic memory cell of claim 1, wherein the capacitive element is formed from one of the junction of one or more of the first transistor or the second transistor, or the junction of one or more diode elements.

5. The dynamic memory cell of claim 1, wherein the first transistor and at least one of the second transistor, the data output line, or the word read select line are formed as part of the substrate.

6. The dynamic memory cell of claim 1, wherein the first transistor and the capacitive element are formed as part of the substrate, and wherein at least one of the second transistor, the data output line, or the word read select line are formed on one or more layers proximate to the substrate.

7. The dynamic memory cell of claim 1, wherein the gate of the third transistor is activated by a word read select line, and wherein the source of the third transistor is connected to a voltage and current source that provides current when the word read select line is active.

8. The dynamic memory cell of claim 1, further comprising a feedback mechanism connected to the word read select line, wherein the feedback mechanism is configured to:
 capture one or more input values as the one or more input values are stored in the dynamic memory cell; and
 adjust the one or more input values such that the one or more values stored in the dynamic memory cell converge to cause a resultant output to match one or more nominal values that represent data stored by the dynamic memory cell.

9. A dynamic memory cell comprising: an input; a capacitive element coupled to the input, wherein the capacitive element stores one or more values corresponding to one of multiple voltage levels; a transistor coupled to the capacitive dement via a gate of the transistor, wherein the charge on the capacitive element controls operation of the transistor, wherein the transistor operates in source-follower mode to enable different voltage levels to be accessed from the capacitive element corresponding to a plurality of values; and an output connected to the drain of the transistor, wherein current flows through the transistor when the output is activated to access the one or more values, corresponding to the different voltage levels, stored in capacitive element and wherein a word read select line comprises a third transistor directly connected to the drain of the transistor.

10. The dynamic memory cell of claim 9, wherein the input comprises an input transistor connected to the capacitive element via a channel of the transistor.

11. The dynamic memory cell of claim 9, wherein the capacitive element is separate from the transistor.

12. The dynamic memory cell of claim 9, wherein the capacitive element and the transistor are formed on or as part of a substrate.

13. The dynamic memory cell of claim 9, wherein the capacitive element is formed as part of a substrate, and the transistor is formed as part of the substrate or on a layer proximate to the substrate.

14. The dynamic memory cell of claim 9, wherein the output comprises the third transistor.

* * * * *